(12) United States Patent
Hasegawa et al.

(10) Patent No.: US 6,504,688 B2
(45) Date of Patent: Jan. 7, 2003

(54) MAGNETORESISTIVE SENSOR CAPABLE OF PROVIDING STRONG EXCHANGE COUPLING MAGNETIC FIELD, AND THIN-FILM MAGNETIC HEAD USING THE SAME

(75) Inventors: Naoya Hasegawa, Niigata-ken (JP); Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/998,548

(22) Filed: Nov. 29, 2001

(65) Prior Publication Data

US 2002/0097539 A1 Jul. 25, 2002

(30) Foreign Application Priority Data

Dec. 1, 2000 (JP) ........................................ 2000-366927

(51) Int. Cl.[7] .............................................. G11B 5/127
(52) U.S. Cl. .................................................. 360/324.11
(58) Field of Search ........................ 360/324.1, 324.11, 360/126, 121

(56) References Cited

U.S. PATENT DOCUMENTS 5,910,868 A 6/1999 Kurosawa et al.
6,055,135 A * 4/2000 Fukamichi et al.

FOREIGN PATENT DOCUMENTS

| JP | 10-214716 | 8/1998 |
| JP | 11-191647 | 7/1999 |

* cited by examiner

Primary Examiner—Allen Cao
(74) Attorney, Agent, or Firm—Brinks Hofer Gilson & Lione

(57) ABSTRACT

A twin boundary is formed in an antiferromagnetic layer (PtMn) that is not parallel to an interface between the antiferromagnetic layer and a ferromagnetic layer. With that crystal orientation, when the antiferromagnetic layer is transformed to regular lattices, the atomic array is changed to a mirror-symmetrical structure, and therefore lattice strain created in a direction parallel to the interface is relaxed. As a result, the transformation to regular lattices in the antiferromagnetic layer can be promoted effectively, and a strong exchange coupling magnetic field is produced.

49 Claims, 17 Drawing Sheets

MAGNETORESISTIVE SENSOR CAPABLE OF PROVIDING STRONG EXCHANGE COUPLING MAGNETIC FIELD, AND THIN-FILM MAGNETIC HEAD USING THE SAME

BACKGROUND OF THE INVENTION

1. Field of the Invention

The present invention relates to an exchange coupling film made up of an antiferromagnetic layer and a ferromagnetic layer, in which the direction of magnetization of the ferromagnetic layer is pinned in a certain direction by an exchange (anisotropic) coupling magnetic field generated at the interface between the antiferromagnetic layer and the ferromagnetic layer. More particularly, the present invention relates to an exchange coupling film capable of providing a strong exchange coupling magnetic field, a magnetoresistive sensor (spin-valve type magnetoresistive sensor or AMR sensor) using the exchange coupling film, and a thin-film magnetic head using the magnetoresistive sensor.

2. Description of the Related Art

A spin-valve type magnetoresistive sensor is one of GMR (giant magnetoresistive) sensors utilizing the giant magnetoresistive effect, and is employed to detect a recording magnetic field on a recording medium such as a hard disk.

Of the GMR sensors, a spin-valve type magnetoresistive sensor has several advantages in that the structure is relatively simple and resistance can be changed with a weak magnetic field.

The spin-valve type magnetoresistive sensor comprises, in the simplest structure, an antiferromagnetic layer, a pinned magnetic layer, a nonmagnetic intermediate layer, and a free magnetic layer. The antiferromagnetic layer and the pinned magnetic layer are formed in contact with each other. Because an exchange coupling magnetic field is generated at the interface between the antiferromagnetic layer and the pinned magnetic layer, the pinned magnetic layer is put into a single domain state and a direction of magnetization thereof is pinned in a certain direction. The magnetization of the free magnetic layer is aligned by bias layers formed on both sides thereof in a direction substantially crossing the direction of magnetization of the pinned magnetic layer. The magnetization of the free magnetic layer varies depending on a magnetic field leaked from a recording medium, whereby electrical resistance is changed based on the relationship with respect to the magnetization of the pinned magnetic layer. As a result, the leaked magnetic field is reproduced.

It is known that the exchange coupling magnetic field is generated upon transformation of the antiferromagnetic layer from irregular lattices (face-centered-cubic lattices) to regular lattices (face-centered-tetragonal lattices) when the antiferromagnetic layer and the pinned magnetic layer are formed as a multilayer and subjected to a heat treatment.

In this connection, the inventors have found that, when the interior of crystals of the antiferromagnetic layer is under the condition, described below, after the above two layers have been formed as a multilayer and subjected to heat treatment, the antiferromagnetic layer is not satisfactorily transformed to regular lattices, and the exchange coupling magnetic field generated between the antiferromagnetic layer and the ferromagnetic layer is very weak.

FIG. 19 is a schematic illustration of an electron micrograph that is obtained by imaging, with an electron microscope, a section of a conventional multilayered structure of an antiferromagnetic layer and a pinned magnetic layer taken along the direction of film thickness. Note that FIG. 19 represents the state after being subjected to heat treatment.

Referring to FIG. 19, an antiferromagnetic layer 53 is formed of, for example, a PtMn alloy and a ferromagnetic layer 54 is formed of, for example, a NiFe alloy. Grain boundaries 55 are formed in the antiferromagnetic layer 53 and extend from the interface to an upper surface. Crystal grains formed on both sides of the grain boundaries 55 have crystal azimuths different from each other.

Further, a twin 56 is formed in the antiferromagnetic layer 53. Herein, the term "twin" means one solid in which two or more single crystals of one substance are combined with each other in accordance with a particular symmetrical relationship. In the structure of FIG. 19, the twin 56 includes twin boundaries 57 extending in a direction (X-direction indicated in FIG. 19) parallel to the interface between the antiferromagnetic layer 53 and the ferromagnetic layer 54. The twin 56 has an atomic array being mirror-symmetrical about the twin boundaries 57.

It has been expected that a strong exchange coupling magnetic field can be obtained upon formation of the twin boundaries 57. Such an expectation has been based on an assumption that, with the formation of the twin boundaries 57, an atomic array is changed to become mirror-symmetrical in a relevant area and lattice strains caused upon transformation to regular lattices are relaxed, whereby the transformation to regular lattices is promoted satisfactorily.

It has been found, however, that the exchange coupling film shown in FIG. 19 provides only a very weak exchange coupling magnetic field. The reason is presumably that the twin boundaries 57 are formed to extend in the direction parallel to the interface between the antiferromagnetic layer 53 and the ferromagnetic layer 54. In other words, the twin boundaries 57 extending in the direction parallel to the interface between both the layers are formed to relax lattice strain created in a direction of film thickness (Z-direction indicated in FIG. 19), and the lattice strain in the direction parallel to the interface are not relaxed. Eventually, the transformation to regular lattices is not promoted satisfactorily.

Thus, in FIG. 19, atoms of the antiferromagnetic layer 53 at the interface are in a state tightly bound to the crystal structure of the ferromagnetic layer 54, and the transformation to regular lattices is not developed satisfactorily at the interface. This results in a very weak exchange coupling magnetic field.

SUMMARY OF THE INVENTION

With the view of overcoming the above-mentioned problems in the related art, it is an object of the present invention to provide an exchange coupling film in which a twin boundary is not formed in an antiferromagnetic layer parallel to the interface between the antiferromagnetic layer and a ferromagnetic layer, and hence is capable of producing a strong exchange coupling magnetic field. Another object is to provide a magnetoresistive sensor using the exchange coupling film, and a thin-film magnetic head using the magnetoresistive sensor.

To achieve the above objects, according to the present invention, an exchange coupling film is made up an antiferromagnetic layer and a ferromagnetic layer formed in contact with each other, and the direction of magnetization of the ferromagnetic layer is held in a certain direction by an exchange coupling magnetic field generated at an interface between the antiferromagnetic layer and the ferromagnetic layer. In the antiferromagnetic layer, crystal planes other than an equivalent crystal plane represented by {111} plane are oriented at least partly among crystal planes lying in a direction parallel to the interface. A twin is formed in at least a part of the antiferromagnetic layer, and a twin boundary is formed in at least a part of the twin that is not parallel to the interface.

The present invention is based on the findings as follows. When the above-mentioned twin boundary appears after forming and heat-treating the exchange coupling film, atoms of the antiferromagnetic layer are not in a bound condition to the crystal structure of the ferromagnetic layer in the film forming stage. With such weakening of binding forces at the interface, the antiferromagnetic layer is more likely to transform from irregular lattices (face-centered-cubic lattices) to regular lattices (face-centered-tetragonal lattices) under the heat treatment.

The transformation, however, causes lattice strains. Unless those lattice strains are satisfactorily relaxed, it is impossible to develop the transformation effectively. In the transformation process, it is envisaged that atoms of the antiferromagnetic layer are rearranged from irregular lattices to regular lattices, and lattice strains caused at that occasion are relaxed as the atomic array is changed to a mirror-symmetrical structure at short distance intervals. After the heat treatment, the boundary, about which the change to the mirror-symmetrical structure has occurred, becomes a twin boundary. The formation of such a twin boundary means that the transformation to regular lattices has occurred under the heat treatment.

In the vicinity of the interface between the antiferromagnetic layer and the ferromagnetic layer, the twin boundary is formed in a direction crossing the interface to relax lattice strains caused upon atoms being rearranged in a direction parallel to the interface. Therefore, when the satisfactory transformation to regular lattices occurs as a whole, the twin boundary is not formed parallel to the interface. The present invention is based on that point. Thus, in the present invention, the twin boundary is not formed parallel to the interface, and a very strong exchange coupling magnetic field can be produced.

On the other hand, when atoms cannot be rearranged in the direction parallel to the interface, for example, when atoms of the antiferromagnetic layer are tightly bound at the interface to the crystal structure of the ferromagnetic layer, the twin boundary is not formed in a crossing relation to the interface. In such a condition, the twin boundary is not formed at all or formed parallel to the interface.

Further, in the present invention, an included angle between the twin boundary and the interface is preferably in the range of 10° to 67° or in the range of 77° to 90°. When the included angle is in either range, the crystal planes other than {111} plane are oriented in at least a part of the antiferromagnetic layer in a direction parallel to the interface.

Also, preferably, grain boundaries are formed in the antiferromagnetic layer and the ferromagnetic layer with crystal azimuths differing from each other on both sides of the grain boundary, and at least a part of the grain boundaries and/or twin boundaries formed in the antiferromagnetic layer is discontinuous at the interface from the grain boundaries formed in the ferromagnetic layer.

Furthermore, in the present invention, it is preferable that an equivalent crystal plane typically represented by {111} plane is preferentially oriented in the ferromagnetic layer, whereas the crystal planes other than {111} plane are preferentially oriented in the antiferromagnetic layer, or the antiferromagnetic layer is under random orientation. As an alternative, preferably, the crystal planes other than the equivalent crystal plane typically represented by {111} plane are preferentially oriented in each of the antiferromagnetic layer and the pinned magnetic layer, or both the layers are under random orientation.

With the crystal orientation set forth above, the antiferromagnetic layer and the ferromagnetic layer are each less likely to grow epitaxially, and atoms in the antiferromagnetic layer are prevented from being bound to the crystal structure of the ferromagnetic layer. The antiferromagnetic layer therefore tends to transform to regular lattices with the heat treatment.

The crystal orientation is adjusted in accordance with several factors including: the sequence in forming the respective films, the presence or absence of an underlying buffer layer, the composition ratio of the antiferromagnetic layer, and the film forming conditions.

In the present invention, the antiferromagnetic layer is preferably made of an antiferromagnetic material containing an element X and Mn. Where X represents one or more elements selected from among Pt, Pd, Ir, Rh, Ru and Os.

As an alternative, the antiferromagnetic layer is preferably made of the element X, an element X' and Mn. Where X' represents one or more elements selected from among Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements. In this case, the antiferromagnetic material is preferably an intrusion type solid solution in which the element X' intrudes in gaps between space lattices constituted by the element X and Mn, or a substitution type solid solution in which the element X' substitutes for a part of lattice points of crystal lattices constituted by the element X and Mn.

Also, in the present invention, the exchange coupling film is preferably formed such that the antiferromagnetic layer is formed on an underlying buffer film or a lower gap layer. With that structure, in the antiferromagnetic layer, the crystal planes other than the equivalent crystal plane represented by {111} plane tend to orient at least partly among the crystal planes lying in the direction parallel to the interface.

In the present invention, the exchange coupling film set forth above is applicable to various types of magnetoresistive sensors. One magnetoresistive sensor of the present invention comprises an antiferromagnetic layer; a pinned magnetic layer formed in contact with the antiferromagnetic layer and having a direction of magnetization pinned by an exchange anisotropic magnetic field generated in cooperation with the antiferromagnetic layer; a free magnetic layer formed in a multilayer structure with the pinned magnetic layer through a nonmagnetic intermediate layer; and a bias layer for aligning a direction of magnetization of the free magnetic layer in a direction crossing the direction of magnetization of the pinned magnetic layer. The antiferromagnetic layer and the pinned magnetic layer formed in contact with the antiferromagnetic layer constitute as the exchange coupling film set forth above.

Another magnetoresistive sensor of the present invention comprises an antiferromagnetic layer; a pinned magnetic layer formed in contact with the antiferromagnetic layer and having a direction of magnetization pinned by an exchange anisotropic magnetic field generated in cooperation with the antiferromagnetic layer; a free magnetic layer formed in a multilayer structure with the pinned magnetic layer through a nonmagnetic intermediate layer; and antiferromagnetic exchange bias layers formed on an upper or lower side of the free magnetic layer with a spacing left between the antiferromagnetic exchange bias layers in a direction of track width. The exchange bias layers and the free magnetic layer constitute the exchange coupling film set forth above, and magnetization of the free magnetic layer is held in a certain direction.

Still another magnetoresistive sensor of the present invention comprises nonmagnetic intermediate layers formed on upper and lower sides of a free magnetic layer; pinned magnetic layers positioned on an upper side of one of the nonmagnetic intermediate layers and on a lower side of the other nonmagnetic intermediate layer; antiferromagnetic layers positioned on an upper side of one of the pinned magnetic layers and on a lower side of the other pinned magnetic layer for making a direction of magnetization of each pinned magnetic layer pinned in a certain direction by an exchange anisotropic magnetic field; and a bias layer for aligning a direction of magnetization of the free magnetic layer in a direction crossing the direction of magnetization of each pinned magnetic layer. The antiferromagnetic layer and the pinned magnetic layer formed in contact with the antiferromagnetic layer constitute as the exchange coupling film set forth above.

Still another magnetoresistive sensor of the present invention comprises a magnetoresistive layer and a soft magnetic layer formed one above the other with a nonmagnetic layer interposed therebetween, and antiferromagnetic layers formed on an upper or lower side of the magnetoresistive layer with a spacing left between the antiferromagnetic layers in a direction of track width. The antiferromagnetic layers and the magnetoresistive layer constitute the exchange coupling film set forth above.

A thin-film magnetic head according to the present invention is constructed by forming shield layers on upper and lower sides of any type of magnetoresistive sensor, set forth above, through gap layers.

DESCRIPTION OF THE PREFERRED EMBODIMENTS

Figure 1:
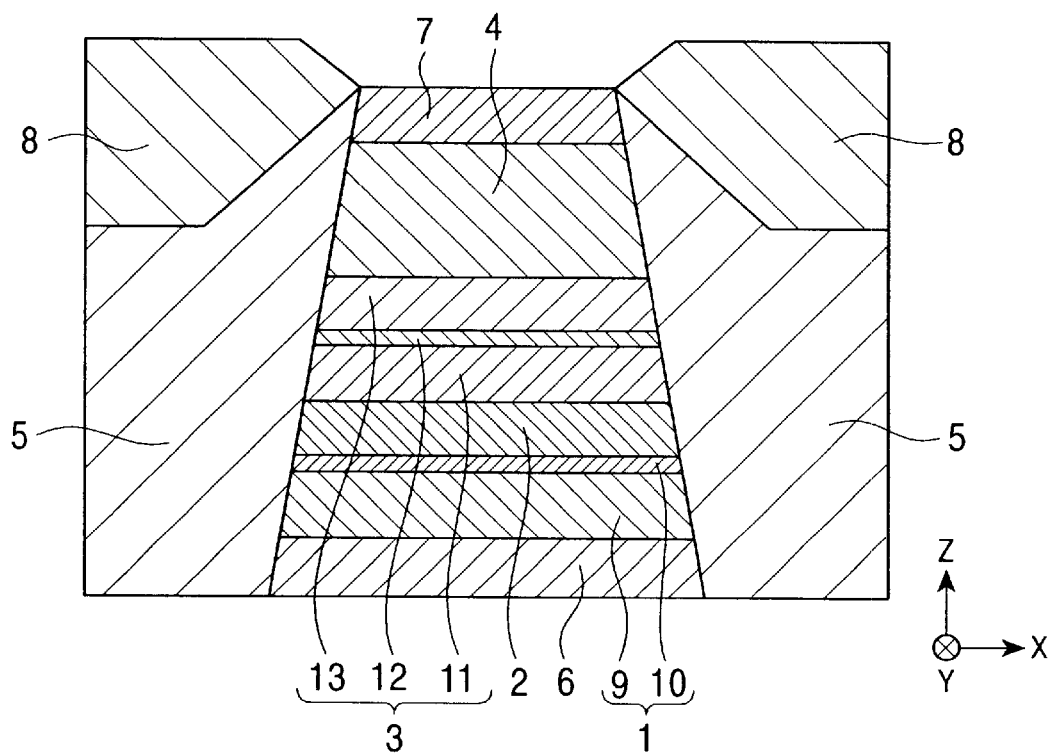
FIG. 1 is a sectional view of a single spin-valve type magnetoresistive sensor according to a first embodiment of the present invention, as viewed from the side facing a recording medium.

FIG. 1 is a sectional view of the overall structure of a single spin-valve type magnetoresistive sensor according to a first embodiment of the present invention, as viewed from the side facing a recording medium. Note that FIG. 1 shows, in section, only a central portion of the sensor extending in an X-direction.

The single spin-valve type magnetoresistive sensor is provided, for example, at a trailing end of a floating slider mounted in a hard disk drive, and detects a recording magnetic field on a disk of the hard disk drive. The moving direction of a magnetic recording medium such as a hard disk is a Z-direction, and the direction of a magnetic field leaked from the magnetic recording medium is a Y-direction.

At the lowermost of the structure shown in FIG. 1, there is formed an underlying buffer layer 6 made of a nonmagnetic material, for example, one or more elements selected from among Ta, Hf, Nb, Zr, Ti Mo and W. The underlying buffer layer 6 is formed in a film thickness of, for example, about 50 Å.

On the underlying buffer layer 6, a free magnetic layer 1 is formed as a two-layer film. The free magnetic layer 1 is made up of two layers, for example, a NiFe alloy film 9 and a Co film 10. By forming the Co film 10 on the side in contact with a nonmagnetic intermediate layer 2 as shown in FIG. 1, metal elements and the like are prevented from diffusing at the interface between the nonmagnetic intermediate layer 2 and free magnetic layer 1, and ΔR/R (resistance change rate) can be increased.

The NiFe alloy film 9 is formed at a ratio of, for example, Ni about 80 (at %) and Fe about 20 (at %). The NiFe alloy film 9 and the Co film 10 are formed, for example, to a thickness of about 45 Å and 5 Å, respectively. The free magnetic layer 1 may be formed as a single layer, or may be formed in a ferri-state structure sandwiching a nonmagnetic layer between two ferromagnetic layers, similar to pinned magnetic layer 3 described below.

The nonmagnetic intermediate layer 2 is formed on the free magnetic layer 1. The nonmagnetic intermediate layer 2 is made of, for example, Cu. When a magnetoresistive sensor of the present invention is a tunnel type magnetoresistive (TMR) sensor utilizing the principle of a tunnel effect, the nonmagnetic intermediate layer 2 is made of an insulating material, such as $Al_2O_3$.

A pinned magnetic layer 3 is formed on the nonmagnetic intermediate layer 2. The pinned magnetic layer 3 is made up of a Co film 11, a Ru film 12 and a Co film 13. The Co film 11 and the Co film 13 are magnetized in directions to develop an anti-parallel state due to an exchange coupling magnetic field generated at the interface between the pinned magnetic layer 3 and an antiferromagnetic layer 4. That is generally called a ferri-magnetic coupling state. With such a structure, the magnetization of the pinned magnetic layer 3 can be stabilized and the exchange coupling magnetic field generated at the interface between the pinned magnetic layer 3 and the antiferromagnetic layer 4 can be increased.

The Co film 11, the Ru film 12, and the Co film 13 are formed respectively to a thickness of, for example, about 20 Å, 8 Å, and 15 Å.

The pinned magnetic layer 3 may be formed as a single-layer film, for example, rather than three-layer film. Also, the respective films 11, 12 and 13 may be formed of materials other than the above-mentioned magnetic materials. For example, $Co_{90}Fe_{10}$ (numerals represented by at %) may be used to form the films 11 and 13.

An antiferromagnetic layer 4 is formed on the pinned magnetic layer 3. The antiferromagnetic layer 4 is preferably made of an antiferromagnetic material containing an element X and Mn. Where X represents one or more elements selected from among Pt, Pd, Ir, Rh, Ru and Os.

Such an X—Mn alloy using those platinum elements has superior characteristics as an antiferromagnetic material; namely, corrosion resistance is superior, the blocking temperature is high, and the exchange coupling magnetic field (Hex) can be increased. Of the platinum elements, in particular, Pt is preferably used. For example, a two-element PtMn alloy can be used.

Also, in the present invention, the antiferromagnetic layer 4 may be made of an antiferromagnetic material containing the element X, an element X' and Mn. Where X' represents one or more selected from among Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements.

The element X' is preferably an element that intrudes gaps between space lattices constituted by the element X and Mn, or that substitutes for a part of lattice points of crystal lattices constituted by the element X and Mn. Herein, a solid solution means a solid, wherein components are homogeneously mixed with each other in one crystal phase.

By thus forming an intrusion or substitution type solid solution, the lattice constant of the X—Mn—X' alloy can be increased in comparison with that of the X—Mn alloy, and therefore a difference in lattice constant between the antiferromagnetic layer 4 and the pinned magnetic layer 3 can be increased. In the case of using the element X' that forms a substitution type solid solution, particularly, if the composition ratio of the element X' is too large, antiferromagnetic characteristics of the layer 4 would be deteriorated and the exchange coupling magnetic field generated at the interface between the antiferromagnetic layer 4 and the pinned magnetic layer 3 would be reduced. For those reasons, it is preferable in the present invention to employ the element X' that forms an intrusion type solid solution and is a rare earth element of inert gas (one or more selected from among Ne, Ar, Kr and Xe). Because of the rare gas element being inert gas, the antiferromagnetic characteristics are not greatly affected even with the rare gas element contained in the film. Further, Ar or the like has been conventionally used as a sputtering gas introduced to a sputtering apparatus, and it can be easily intruded into the film just by properly adjusting a gas pressure.

Using a gaseous element as the element X' makes it difficult to contain a large amount of the element X' in the film. In the case of employing a rare gas element, however, the exchange coupling magnetic field generated under heat treatment can be drastically increased just by diffusing a very small amount of the rare gas element into the film. In the present invention, the composition range of the element X' is preferably in the range of about 0.2 to about 10 at % and, more preferably, in the range of about 0.5 to about 5 at %. Also, in the present invention, the element X is preferably Pt, and hence a Pt—Mn—X' alloy is preferably used.

On the antiferromagnetic layer 4, a protective barrier layer 7 is formed which is made of a nonmagnetic material, such as one or more elements selected from among Ta, Hf, Nb, Zr, Ti, Mo and W. Preferably, the protective barrier layer 7 is formed with an oxide layer made of Ta or the like and having an oxidized surface.

A pair of hard bias layers 5 and a pair of conductive layers 8 are formed one above the other on both sides of the multilayer film defined between the underlying buffer layer 6 and the protective barrier 7. The magnetization of the free magnetic layer 1 is aligned in a direction of track width (X-direction indicated in FIG. 1) by a bias magnetic field applied from the hard bias layers 5.

Each of the hard bias layers 5 is formed of, for example, a Co—Pt (cobalt-platinum) alloy or a Co—Cr—Pt (cobalt-chromium-platinum) alloy. Each of the conductive layers 8 is made of, for example., α-Ta, Au, Cr, Cu (copper) or W (tungsten). In a tunnel-type magnetoresistive sensor, the conductive layers 8 are formed on the lower side of the free magnetic layer 1 and on the upper side of the antiferromagnetic layer 4, respectively.

After forming the respective layers as described above, in the present invention, the multilayered film is subjected to heat treatment to generate the exchange coupling magnetic field (Hex) at the interface between the antiferromagnetic layer 4 and the pinned magnetic layer 3, whereby the magnetization of the pinned magnetic layer 3 is pinned in a height direction (Y-direction indicated in FIG. 1).

In the antiferromagnetic layer 4 of this embodiment, crystal planes other than an equivalent crystal plane represented by {111} plane are oriented at least partly among crystal planes lying in a direction parallel to the interface between the antiferromagnetic layer 4 and the pinned magnetic layer 3. Such crystal orientation greatly depends on the sequence used to form the separate layers. By forming the antiferromagnetic layer 4 on the pinned magnetic layer 3 as shown in FIG. 1, the crystal planes other than {111} plane are more likely to orient in the antiferromagnetic layer 4.

The crystal orientation is also affected not only the sequence used to form the separate layers, but also the composition ratio and film forming conditions of the antiferromagnetic layer 4 as well as the presence or absence of the underlying buffer layer 6.

Further, in the present invention, it is preferable that the equivalent crystal plane represented by {111} plane is preferentially oriented in the pinned magnetic layer 3, whereas the crystal planes other than the equivalent crystal plane represented by {111} plane are preferentially oriented in the antiferromagnetic layer, or alternatively the antiferromagnetic layer is under random orientation.

Alternatively, in the present invention, the crystal planes other than the equivalent crystal plane typically represented by {111} plane are preferentially oriented in each of the antiferromagnetic layer 4 and the pinned magnetic layer 3, or alternatively both the layers are under random orientation. The crystal orientation in each of the antiferromagnetic layer 4 and the pinned magnetic layer 3 can be confirmed by examining a transmitted-electron-beam diffraction image of the film structure.

With the crystal orientation described above, atoms in the antiferromagnetic layer 4 and atoms in the pinned magnetic layer 3 tend to mismatch at the interface more easily, and the atoms in the antiferromagnetic layer 4 are less likely to be bound to the crystal structure of the pinned magnetic layer 3. That condition promotes proper transformation from irregular lattices (face-centered-cubic lattices) to regular lattices (face-centered-tetragonal lattices) in the antiferromagnetic layer 4 under the heat treatment. Additionally, the face-centered-tetragonal lattices are preferably of the CuAu—I type.

The term "mismatched state" means the so-called misaligned state wherein atoms in the layers 3 and 4 are not positioned in a one-to-one opposing relation at the interface. The misaligned state is preferably present not only after but also before the heat treatment.

In the present invention, a twin is formed in the antiferromagnetic layer 4, and a twin boundary formed in at least a part of the twin is not parallel to the interface. This condition of the twin boundary is attained after the heat treatment.

An atomic array is changed to a mirror-symmetrical structure on both sides of the twin boundary, and the change to the mirror-symmetrical structure contributes to properly relaxing lattice strains caused upon the transformation to regular lattices. When the twin boundary is not parallel to the interface, as realized in the present invention, the lattice strains created in the direction parallel to the interface and lattice strains created in the direction of film thickness upon the transformation to regular lattices are both satisfactorily relaxed. Thus, the transformation to regular lattices is promoted effectively and a strong exchange coupling magnetic field can be produced in the present invention.

Spin-valve films in respective embodiments of the present invention and a spin-valve film as a comparative example were formed and examined to determine the internal state of crystals of each spin-valve film by using a transmission electron microscope.

Figure 9:
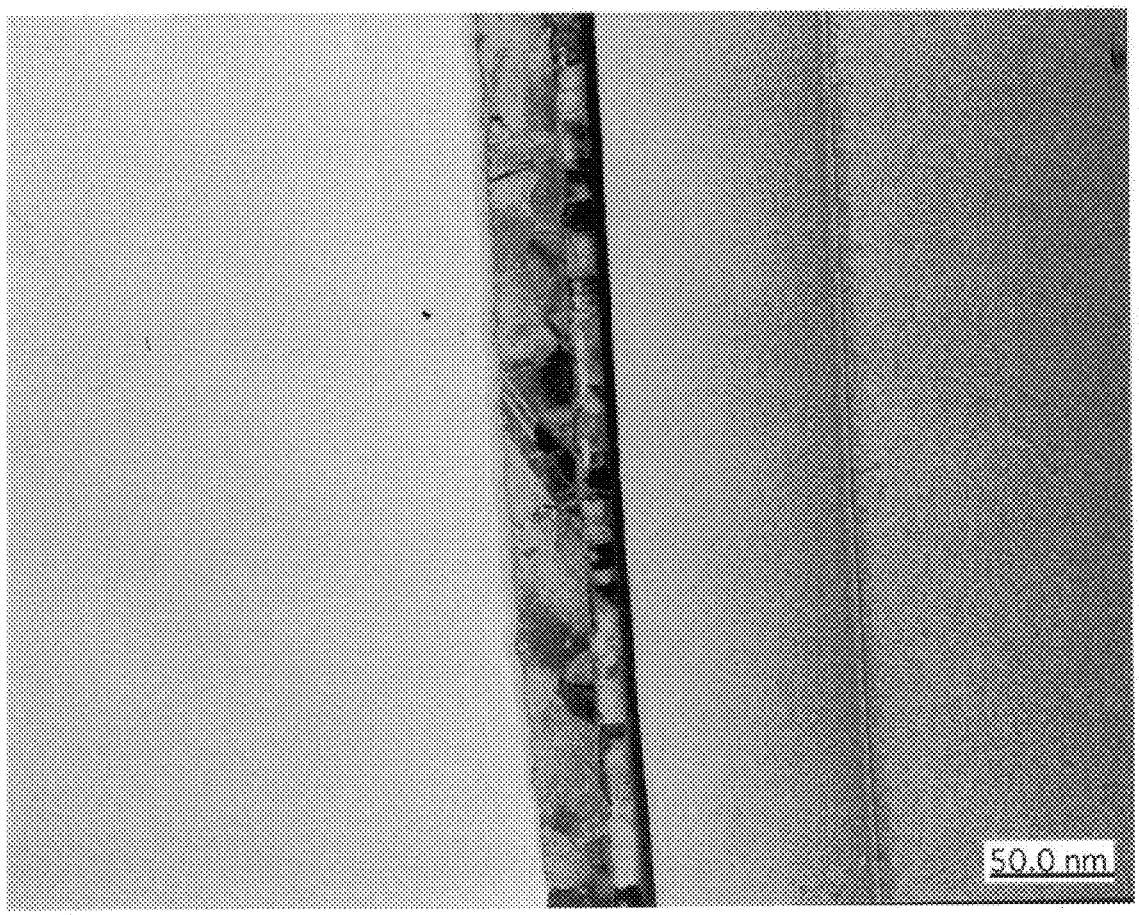
FIG. 9 is an electron micrograph, taken by a transmission electron microscope, of a section of a spin-valve film fabricated in accordance with the first embodiment cut in a direction parallel to the direction of film thickness.

FIG. 9 is an electron micrograph, taken by a transmission electron microscope, of a section of a spin-valve film in the first embodiment, wherein the antiferromagnetic layer is formed above the ferromagnetic layer. The imaged section was cut in a direction parallel to the direction of film thickness. The structure of the spin-valve film shown in FIG. 9 is as follows. An $Al_2O_3$ film, Ta(50) layer, free magnetic layer of $[Ni_{80}Fe_{20}(60)/Co(10)]$, nonmagnetic intermediate layer of Cu(25), pinned magnetic layer of Co(25), antiferromagnetic layer of $Pt_{52}Mn_{48}(300)$, and Ta(50) layer were sequentially formed on a substrate. The number in each parenthesis refers to a film thickness in Å. The composition ratio in each of the antiferromagnetic layer and the free magnetic layer is represented by at %. The antiferromagnetic layer and the pinned magnetic layer were formed using a DC magnetron sputtering apparatus, and the gas pressure of Ar gas used in forming these two layers was set to 3 mTorr. When forming the antiferromagnetic layer, the distance between the substrate and a target was set to 80 mm.

After forming a spin-valve type magnetoresistive sensor having the above-mentioned film structure, the sensor was subjected to heat treatment at 250° C. for 4 hours. The vacuum pressure during the heat treatment was set to $10^{-7}$ Torr.

Upon examining an electron-beam diffraction image of the film structure, it was confirmed that the antiferromagnetic layer was entirely under random orientation, and the ferromagnetic layer (particularly fcc-Co (pinned magnetic layer) in this embodiment) was under the orientation of {111} plane.

Figure 10:
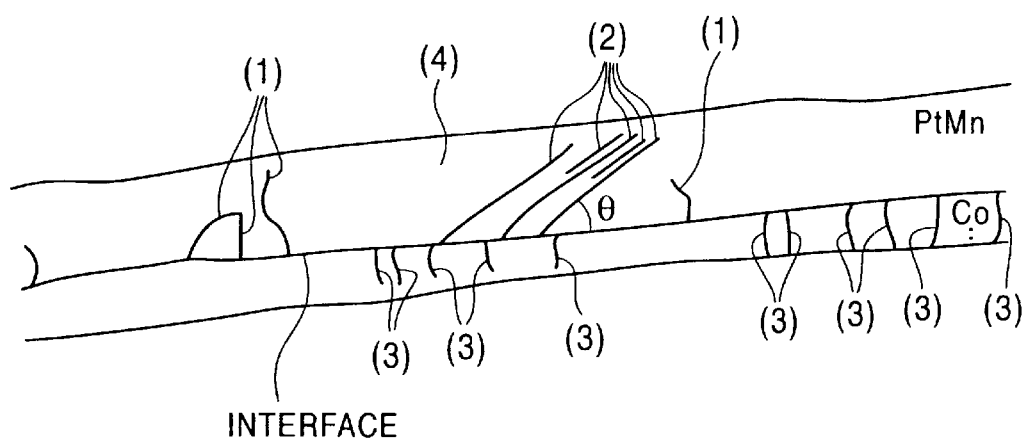
FIG. 10 is a schematic illustration of the electron micrograph of FIG. 9.

FIG. 10 is a schematic illustration of the electron micrograph shown in FIG. 9, which shows the internal state of crystals of the antiferromagnetic layer. Referring to FIG. 10, a plurality of grain boundaries (1) are formed in the antiferromagnetic layer (PtMn) and extend from the interface toward an upper surface. Likewise, a plurality of grain boundaries (3) are formed in the ferromagnetic layer (NiFe/Co/Cu/Co). Crystal grains on both sides of each of the grain boundaries (1) and (3) have crystal azimuths different from each other on both sides thereof.

A twin (4) is formed in the antiferromagnetic layer. The term "twin" means a solid in which two or more single crystals of one substance are combined with each other in accordance with a particular symmetrical relationship. Further, a plurality of twin boundaries (2) are formed in the twin (4). On both sides of each twin boundary (2), an atomic array is changed to a mirror-symmetrical structure. It is also seen that the twin boundaries (2) are not parallel to the interface.

When the twin boundaries formed in the antiferromagnetic layer are not parallel to the interface as in the embodiment shown in FIGS. 9 and 10, the antiferromagnetic layer is transformed from irregular lattices to regular lattices satisfactorily, and a great exchange coupling magnetic field can be produced. Also, an exchange coupling magnetic field of about $5.2 \times 10^4$ (A/m) was obtained in the spin-valve film of FIG. 9.

Figure 11:
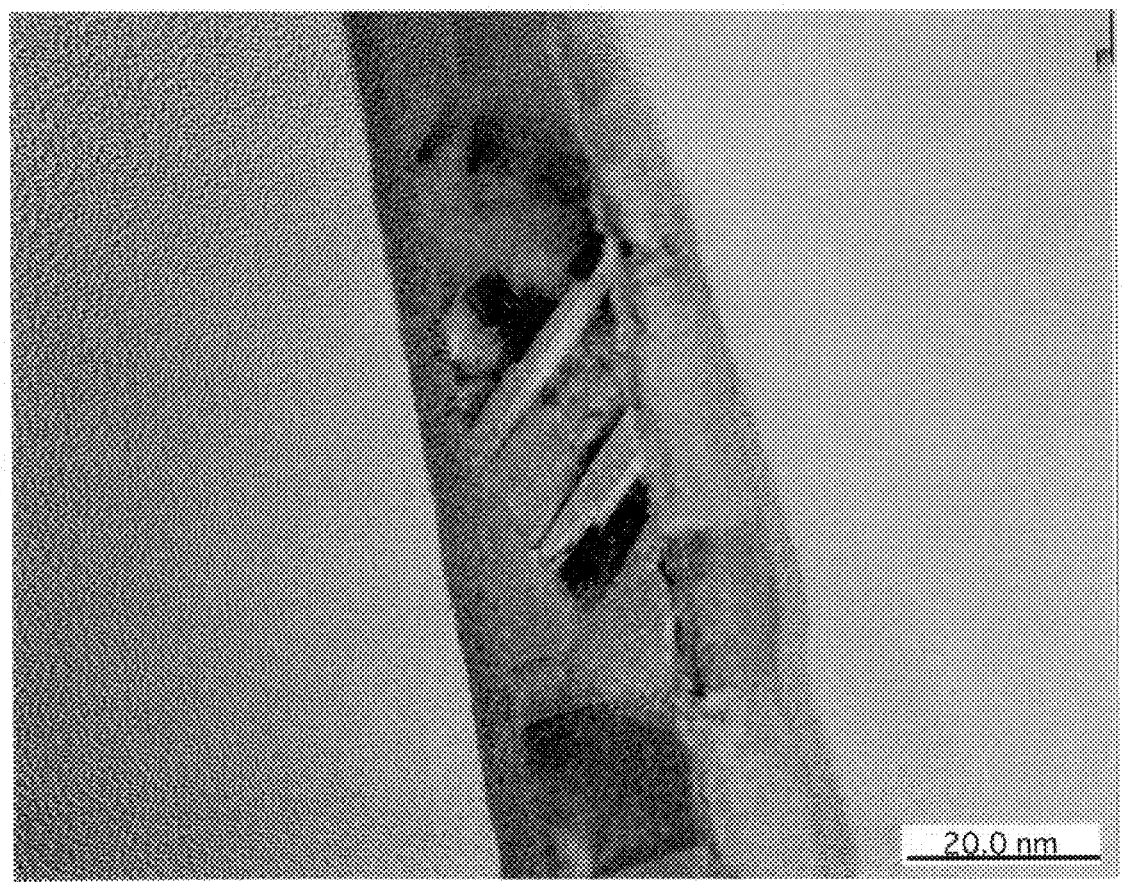
FIG. 11 is an electron micrograph, taken by a transmission electron microscope, of a section of a spin-valve film fabricated in accordance with the second embodiment cut in a direction parallel to the direction of film thickness.

FIG. 11 is an electron micrograph, taken by a transmission electron microscope, of a section of a spin-valve film arranged according to a second embodiment, wherein the antiferromagnetic layer is formed below the ferromagnetic layer. The section is cut in a direction parallel to the direction of film thickness.

The structure of the spin-valve film shown in FIG. 11 is as follows. An $Al_2O_3$ film, Ta(15), seed layer of $Ni_{48}Fe_{12}Cr_{40}(35)$, antiferromagnetic layer of $Pt_{50}Mn_{50}$ (160), pinned magnetic layer of [Co$_{90}$Fe$_{10}$(14)/Ru(9)/-Co$_{90}$Fe$_{10}$(22)], nonmagnetic intermediate layer of Cu(22), free magnetic layer of [Co$_{90}$Fe$_{10}$(10)/Ni$_{80}$Fe$_{20}$(40)], and Ta(30) were sequentially formed on a substrate. The numbers in each parenthesis represents a film thickness in Å. The composition ratio in each of the seed layer, the antiferromagnetic layer, the pinned magnetic layer and the free magnetic layer is represented by at %.

The antiferromagnetic layer and the pinned magnetic layer were formed using a DC magnetron sputtering apparatus, and the gas pressure of Ar gas used in forming these two layers was set to 4 mTorr. When forming the antiferromagnetic layer, the distance between the substrate and a target was set to 70 mm.

After forming a spin-valve type magnetoresistive sensor having the above-mentioned film structure, the sensor was subjected to heat treatment at 270° C. for 4 hours. The vacuum pressure during the heat treatment was set to 10$^{-7}$ Torr.

Upon examining the electron-beam diffraction image of the film structure, it was confirmed that the antiferromagnetic layer was mostly under the orientation of {111} plane, but partly not under the orientation of {111} plane. Also, the ferromagnetic layer (particularly fcc-Co$_{90}$Fe$_{10}$ (pinned magnetic layer) in this embodiment) was under the orientation of {111} plane.

Figure 12:
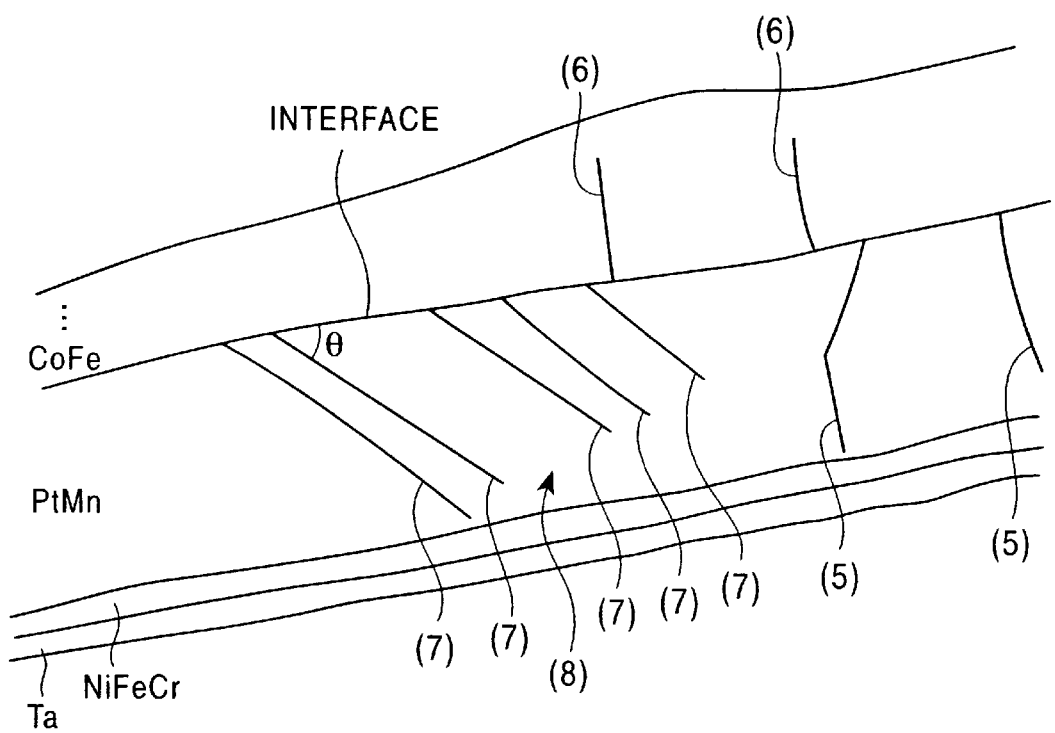
FIG. 12 is a partial schematic illustration of the electron micrograph of FIG. 11.

FIG. 12 is a schematic illustration of the electron micrograph shown in FIG. 11. Referring to FIG. 12, grain boundaries (5) and (6) are formed in the antiferromagnetic layer (PtMn) and the ferromagnetic layer (CoFe) respectively. A twin (8) is formed in the antiferromagnetic layer, and twin boundaries (7) are formed in the twin (8) that are not parallel to the interface. Also, an exchange coupling magnetic field of about 9.6×10$^4$ (A/m) was obtained.

Figure 13:
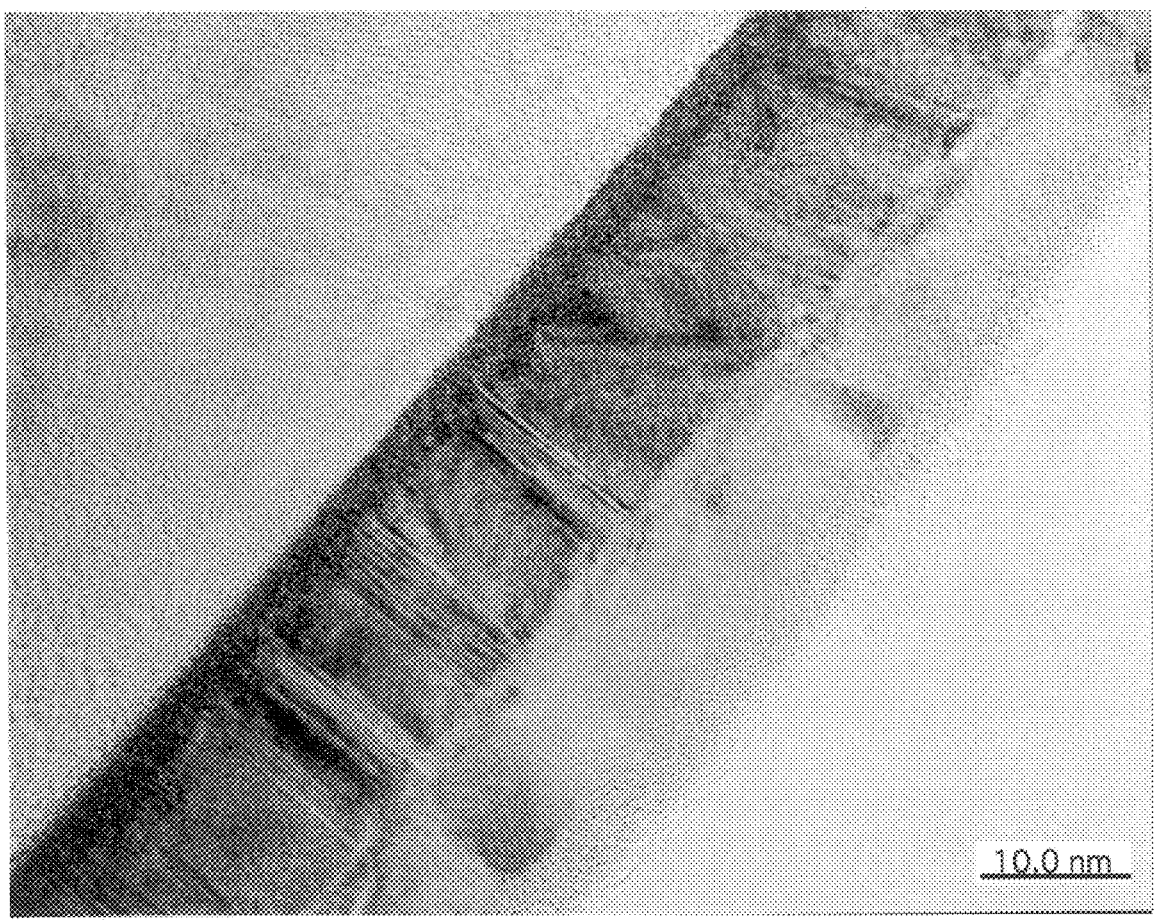
FIG. 13 is an electron micrograph, taken by a transmission electron microscope, of a section of a spin-valve film fabricated in accordance with the third embodiment cut in a direction parallel to the direction of film thickness.

FIG. 13 is an electron micrograph, taken by a transmission electron microscope, of a section of a spin-valve film fabricated in accordance with the third embodiment, wherein the antiferromagnetic layer is formed below the ferromagnetic layer. The section is cut in a direction parallel to the direction of film thickness.

The structure of the spin-valve film shown in FIG. 13 is as follows. An Al$_2$O$_3$ film, Ta(30), antiferromagnetic layer of Pt$_{50}$Mn$_{50}$(140), pinned magnetic layer of [Co$_{90}$Fe$_{10}$(15)/Ru(8)/Co$_{90}$Fe$_{10}$(25)], nonmagnetic intermediate layer of Cu(25), free magnetic layer of [Co$_{90}$Fe$_{10}$(5)/Ni$_{80}$Fe$_{20}$(45)], and Ta(30) were sequentially formed on a substrate. Where the numbers in each parenthesis represents a film thickness in Å. The composition ratio in each of the antiferromagnetic layer, the pinned magnetic layer and the free magnetic layer is represented by at %.

The antiferromagnetic layer and the pinned magnetic layer were formed using a DC magnetron sputtering apparatus, and the gas pressure of Ar gas used in forming those two layers was set to 3 mTorr. When forming the antiferromagnetic layer, the distance between the substrate and a target was set to 80 mm.

After forming a spin-valve type magnetoresistive sensor having the above-mentioned film structure, the sensor was subjected to heat treatment at 270° C. for 4 hours. The vacuum pressure during the heat treatment was set to 10$^{-7}$ Torr.

Upon examining an electron-beam diffraction image of the film structure, it was confirmed that the antiferromagnetic layer was under random orientation, and the ferromagnetic layer (particularly fcc-Co$_{90}$Fe$_{10}$ (pinned magnetic layer) in this embodiment) was also under random orientation.

Figure 14:
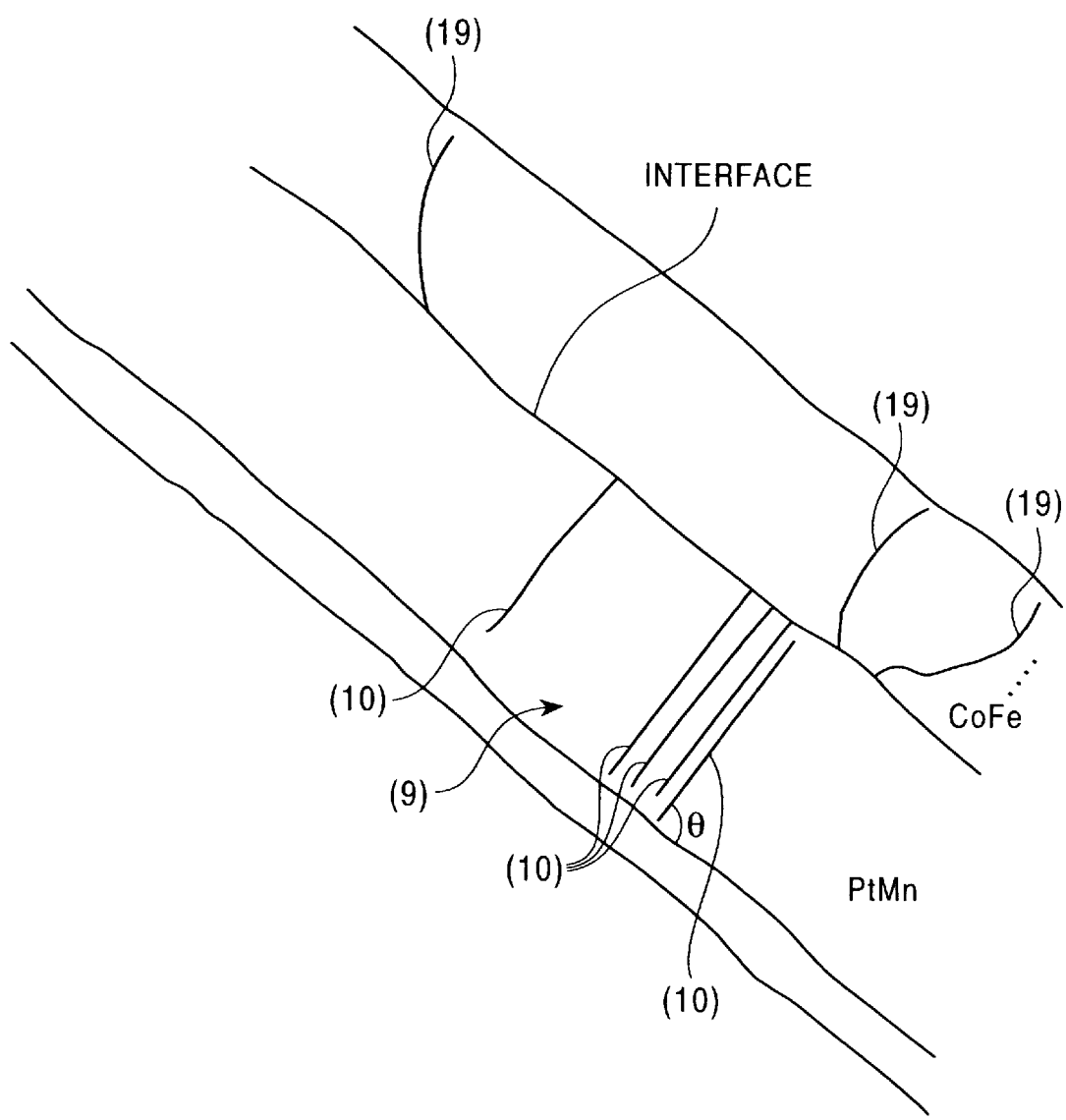
FIG. 14 is a partial schematic illustration of the electron micrograph of FIG. 13.

FIG. 14 is a schematic illustration of the electron micrograph shown in FIG. 13. Referring to FIG. 14, a twin (9) is formed in the antiferromagnetic layer (PtMn), and twin boundaries (10) are formed in the twin (9) not parallel to the interface. Also, an exchange coupling magnetic field of about 12.6×10$^4$ (A/m) was obtained.

Figure 15:
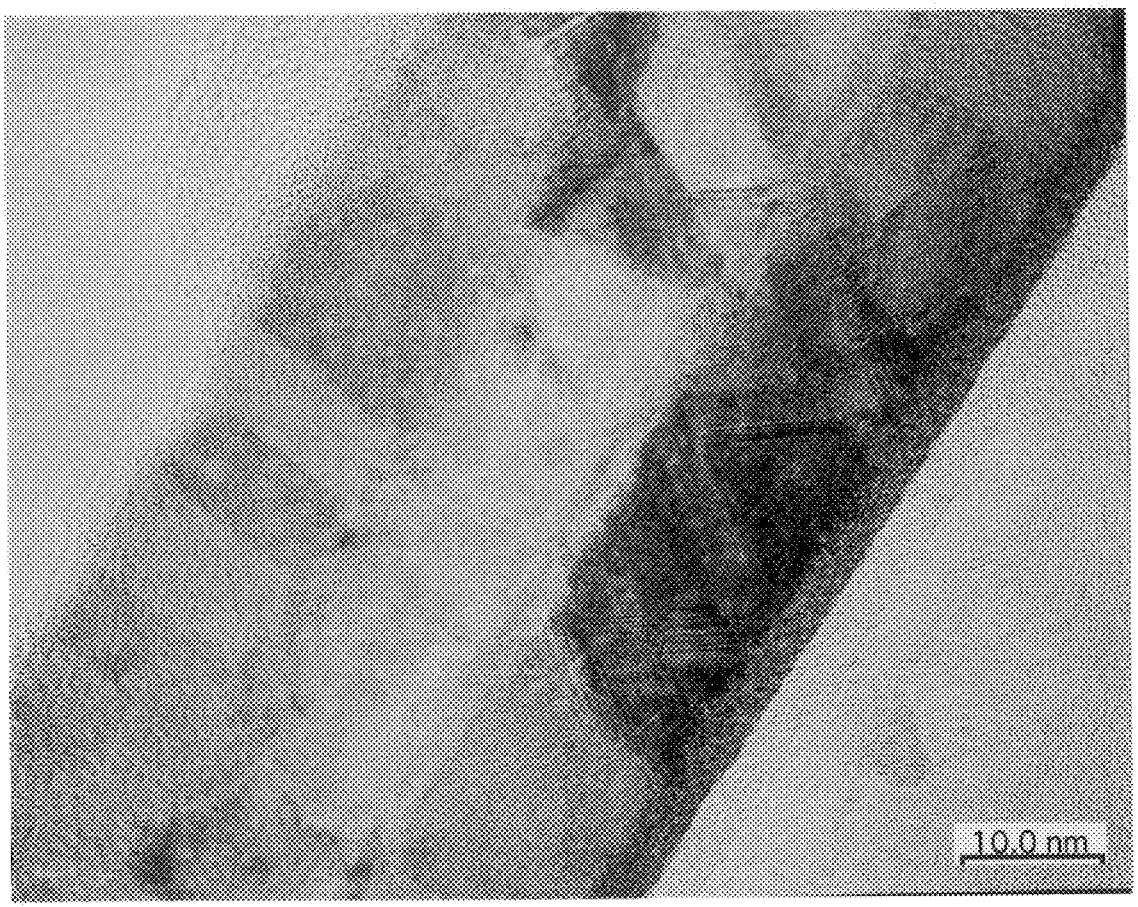
FIG. 15 is an electron micrograph, taken by a transmission electron microscope, of a section of a spin-valve film fabricated in accordance with the fifth embodiment cut in a direction parallel to the direction of film thickness.

FIG. 15 is an electron micrograph, taken by a transmission electron microscope, of a section of a dual spin-valve film fabricated in accordance with the fifth embodiment. The section is cut in a direction parallel to the direction of film thickness.

The structure of the spin-valve film shown in FIG. 15 is as follows. An Al$_2$O$_3$ film, Ta(30), antiferromagnetic layer of Pt$_{50}$Mn$_{50}$(140), pinned magnetic layer of [Co$_{90}$Fe$_{10}$(20)/Ru (8)/Co$_{90}$Fe$_{10}$(25)], nonmagnetic intermediate layer of Cu(25), free magnetic layer of [Co$_{90}$Fe$_{10}$(20)], nonmagnetic intermediate layer of Cu(25), pinned magnetic layer of [Co$_{90}$Fe$_{10}$(25)/Ru(8)/Co$_{90}$Fe$_{10}$(20)], antiferromagnetic layer of Pt$_{50}$Mn$_{50}$(140)], and Ta(30) were sequentially formed on a substrate. Where the numbers in each parenthesis represents a film thickness Å. The composition ratio in each of the antiferromagnetic layers, the pinned magnetic layers and the free magnetic layer is represented by at %.

The antiferromagnetic layer and the pinned magnetic layer were formed using a DC magnetron sputtering apparatus, and the gas pressure of Ar gas used in forming those two layers was set to 3 mTorr. When forming the antiferromagnetic layer, the distance between the substrate and a target was set to 80 mm.

After forming a spin-valve type magnetoresistive sensor having the above-mentioned film structure, the sensor was subjected to heat treatment at 270° C. for 4 hours. The vacuum pressure during the heat treatment was set to 10$^{-7}$ Torr.

Upon examining an electron-beam diffraction image of the film structure, it was confirmed that the antiferromagnetic layer was under random orientation, and the ferromagnetic layer (particularly fcc-Co$_{90}$Fe$_{10}$ (pinned magnetic layer) in this embodiment) was also under random orientation.

Figure 16:
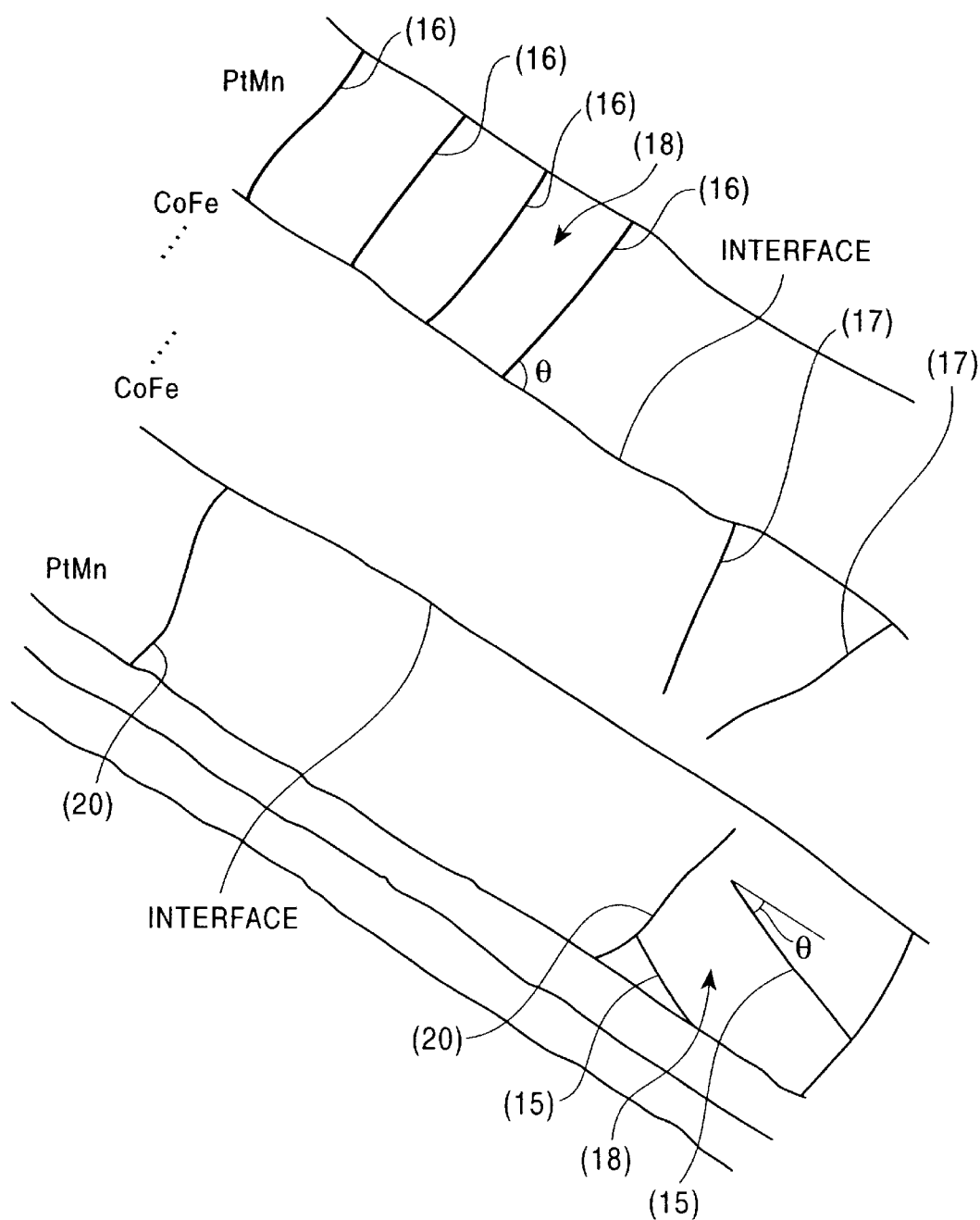
FIG. 16 is a partial schematic illustration of the electron micrograph of FIG. 15.

FIG. 15 is a schematic illustration of the electron micrograph shown in FIG. 16. Referring to FIG. 16, a twin (18) is formed in each of the upper and lower antiferromagnetic layers (PtMn), and twin boundaries (15) and (16) are formed in the twin (18) that are not parallel to the interface. Also, an exchange coupling magnetic field of about 18.2×10$^4$ (A/m) was obtained.

Figure 17:
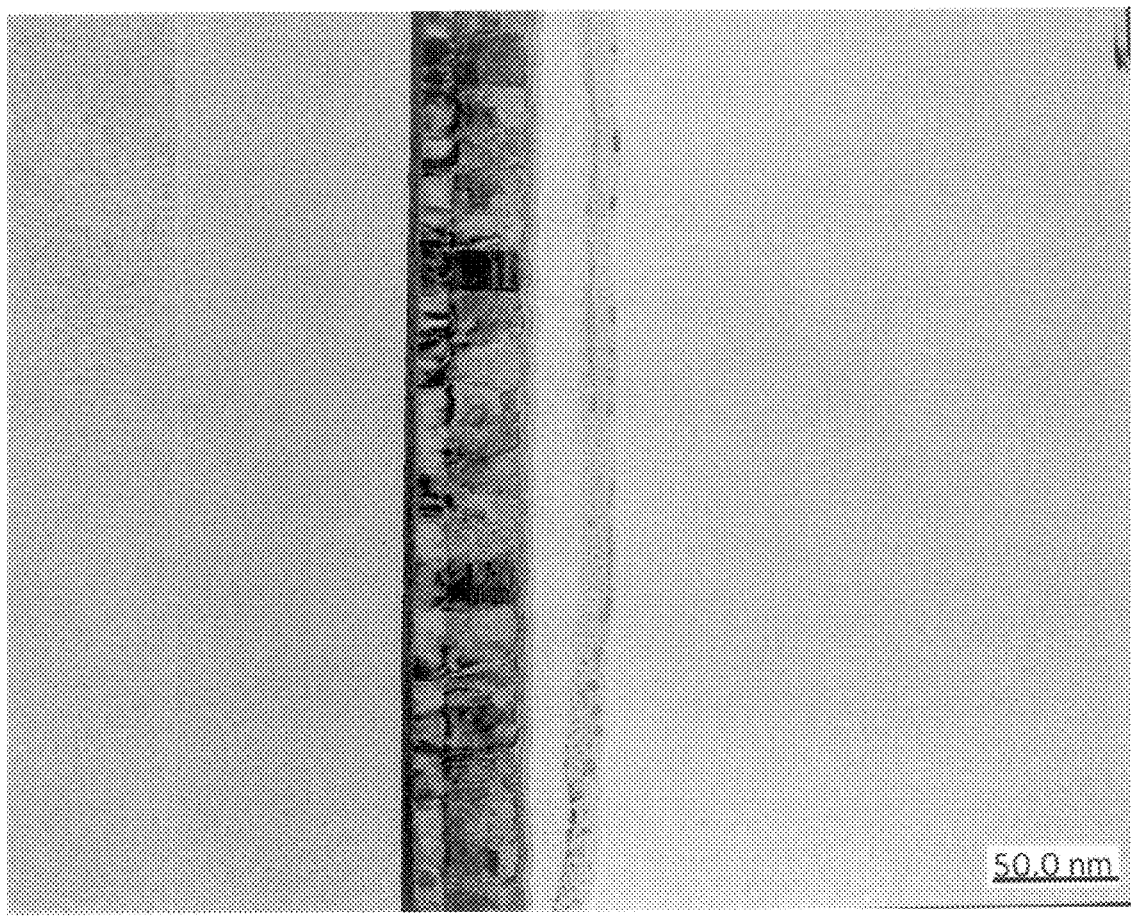
FIG. 17 is an electron micrograph, taken by a transmission electron microscope, of a section of a spin-valve film as a comparative example cut in a direction parallel to the direction of film thickness.

FIG. 17 is an electron micrograph, taken by a transmission electron microscope, of a section of a spin-valve film as the comparative example. The section is cut in a direction parallel to the direction of film thickness.

The structure of the spin-valve film shown in FIG. 17 is as follows. An Al$_2$O$_3$ film, Ta(50), free magnetic layer of [Ni$_{80}$Fe$_{20}$(60)/Co(100)], nonmagnetic intermediate layer of Cu(25), pinned magnetic layer of Co(25), antiferromagnetic layer of Pt$_{44.5}$Mn$_{55.5}$(300), and Ta(50) were sequentially formed on a substrate. Where the numbers in each parenthesis represents a film thickness in Å. The composition ratio in each of the free magnetic layer and the antiferromagnetic layer is represented by at %.

The antiferromagnetic layer and the pinned magnetic layer were formed using a DC magnetron sputtering apparatus, and the gas pressure of Ar gas used in forming those two layers was set to 0.8 mTorr. When forming the antiferromagnetic layer, the distance between the substrate and a target was set to 45 mm.

After forming a spin-valve type magnetoresistive sensor having the above-mentioned film structure, the sensor was subjected to heat treatment at 250° C. for 4 hours. The vacuum pressure during the heat treatment was set to $10^{-7}$ Torr.

Upon examining an electron-beam diffraction image of the film structure, it was confirmed that the antiferromagnetic layer and the ferromagnetic layer (particularly fcc-Co (pinned magnetic layer) in the comparative example) were each under the orientation of {111} plane.

Figure 18:
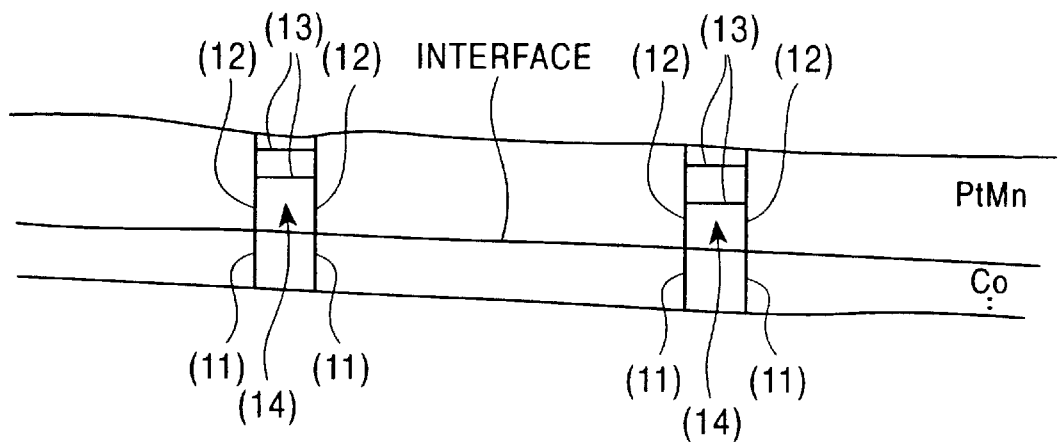
FIG. 18 is a partial schematic illustration of the electron micrograph of FIG. 17.
Figure 19:
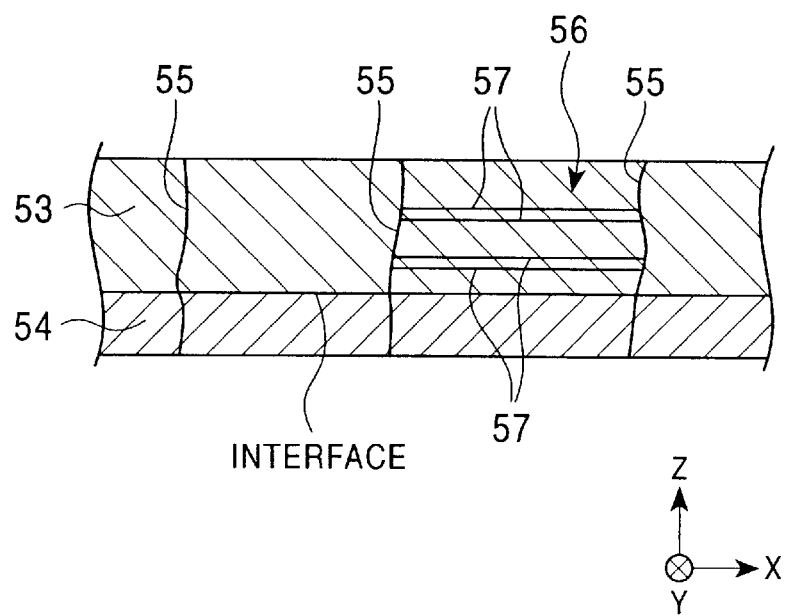
FIG. 19 is a schematic illustration of an electron micrograph, taken by a transmission electron microscope, of a section of a conventional spin-valve film (exchange coupling film) cut in a direction parallel to the direction of film thickness.

FIG. 18 is a schematic illustration of the electron micrograph shown in FIG. 17. Referring to FIG. 18, grain boundaries (11) and (12) are formed respectively in the ferromagnetic layer (Co) and the antiferromagnetic layer (PtMn). A twin (14) is formed in the antiferromagnetic layer, and a plurality of twin boundaries (13) are formed in the twin (14).

In the comparative example, the twin boundaries (13) are parallel to the interface between the antiferromagnetic layer and the ferromagnetic layer. When the twin boundaries (13) are parallel to the interface like the comparative example, the transformation to regular lattices is not satisfactorily developed in the antiferromagnetic layer in the direction parallel to the interface, and a produced exchange coupling magnetic field is weak.

In the comparative example shown in FIG. 17, a value of the exchange coupling magnetic field was about $0.55 \times 10^4$ (A/m) which is much smaller than the values obtained in the embodiments of the present invention.

In order to make the twin boundary formed in the antiferromagnetic layer not parallel to the interface between the antiferromagnetic layer and the ferromagnetic layer as realized in the present invention, film forming conditions are also important factors in addition to the composition of the antiferromagnetic layer. The film forming conditions include, for example, the heat treatment temperature and time, the Ar gas pressure used in forming the antiferromagnetic layer and the ferromagnetic layer, the distance between the substrate and the target, the substrate temperature, the film forming rate, and the substrate bias voltage.

Also, the non-parallel state of the twin boundary realized in the present invention represents a state after the heat treatment. It is not important whether the twin boundary is formed during the film forming stage. In other words, even when the twin boundary is not formed during the film forming stage, a twin boundary may sometimes appear that is not parallel to the interface, after the heat treatment of the present invention.

Further, in the present invention, an included angle θ between the twin boundary and the interface is preferably in the range of 10° to 67° or in the range of 77° to 90°. When the included angle θ is in either range, crystal planes other than {111} plane are oriented in at least a part of the antiferromagnetic layer in the direction parallel to the interface.

In the first embodiment shown in FIG. 9, the included angle θ (see FIG. 10) was about 36°. In the second embodiment shown in FIG. 11, the included angle θ (see FIG. 12) was about 42°. In the third embodiment shown in FIG. 13, the included angle θ (see FIG. 14) was about 87°. In the fifth embodiment shown in FIG. 15, the included angle θ (see FIG. 16) formed between the twin boundary and the lower antiferromagnetic layer was about 22°, and the included angle θ formed between the twin boundary and the upper antiferromagnetic layer was about 85°.

Also, in the present invention, it is preferable that grain boundaries are formed in the antiferromagnetic layer and the ferromagnetic layer with crystal azimuths differing from each other on both sides of the grain boundary. Further, it is preferred that at least a part of the grain boundaries and/or twin boundaries formed in the antiferromagnetic layer are discontinuous from the grain boundaries formed in the ferromagnetic layer at the interface.

In the embodiments shown in FIGS. 9 to 16, apparently, the grain boundaries (1), (5) and (20) formed in the antiferromagnetic layer are discontinuous at the interface from the grain boundaries (3), (6) and (17) formed in the ferromagnetic layer. Further, at the interface between the antiferromagnetic layer and the ferromagnetic layer, the twin boundaries (2), (7), (10), (15) and (16) formed in the antiferromagnetic layer are discontinuous from the grain boundaries (3), (6), (19) and (17) formed in the ferromagnetic layer.

In the comparative example shown in FIGS. 17 and 18, however, it is apparent that the grain boundaries (12) formed in the antiferromagnetic layer are continuous at the interface with the grain boundaries (11) formed in the ferromagnetic layer.

Where the grain boundaries formed in the antiferromagnetic layer and the ferromagnetic layer are discontinuous from each other at the interface, as realized in the present invention, the antiferromagnetic layer is satisfactorily transformed from irregular lattices to regular lattices under the heat treatment. Furthermore, a strong exchange coupling magnetic field can be produced. On the other hand, where the grain boundaries formed in the antiferromagnetic layer and the ferromagnetic layer are continuous with each other at the interface, as occurred in the comparative example, the antiferromagnetic layer and the ferromagnetic layer are epitaxially grown in the film forming stage. Hence the antiferromagnetic layer cannot satisfactorily transform to regular lattices even with the heat treatment. This results in a weak exchange coupling magnetic field.

With the crystal orientation formed in accordance with the invention, atoms in the antiferromagnetic layer 4 and atoms in the pinned magnetic layer 3 tend to mismatch at the interface more easily, and the atoms in the antiferromagnetic layer 4 are less likely to be bound to the crystal structure of the pinned magnetic layer 3. That condition promotes proper transformation from irregular lattices (face-centered-cubic lattices) to regular lattices (face-centered-tetragonal lattices) in the antiferromagnetic layer 4 under the heat treatment. Additionally, the face-centered-tetragonal lattices are preferably of the CuAu—I type.

The term "mismatched state" means the so-called misaligned state, wherein atoms in the layers 3 and 4 are not positioned in a one-to-one opposing relation at the interface. The misaligned state is preferably present not only after but also before the heat treatment.

In the present invention, a twin is formed in the antiferromagnetic layer 4, and a twin boundary formed in at least a part of the twin is not parallel to the interface. That condition of the twin boundary corresponds to one after the heat treatment.

An atomic array is changed to a mirror-symmetrical structure on both sides of the twin boundary, and the change to the mirror-symmetrical structure contributes to properly relaxing lattice strains created upon the transformation to regular lattices. When the twin boundary is not parallel to the interface, as realized in the present invention, the lattice strains created in the direction parallel to the interface and lattice strains created in the direction of film thickness upon the transformation to regular lattices are both satisfactorily relaxed. Accordingly, the transformation to regular lattices is promoted effectively. As a result, a strong exchange coupling magnetic field can be produced in the present invention. The twin boundary formed in the present invention can be observed by taking imaging with an electron microscope as described above with reference to FIGS. 9 to 16.

As seen from the electron micrographs, the twin boundaries (2) in FIGS. 9 and 10, the twin boundaries (7) in FIGS. 11 and 12, the twin boundaries (10) in FIGS. 13 and 14, and the twin boundaries (15), (16) in FIGS. 15 and 16 are not parallel to the interface.

On the other hand, when the twin boundary is not formed in the antiferromagnetic layer after the heat treatment, or when the twin boundary is formed but is parallel to the interface, the lattice strains created in the direction parallel to the interface, in particular, cannot be satisfactorily relaxed and the transformation to regular lattices is not promoted.

In the above case, presumably, the antiferromagnetic layer and the pinned magnetic layer grow epitaxially, and atoms in the antiferromagnetic layer are tightly bound to the crystal structure of the ferromagnetic layer. The antiferromagnetic layer, therefore, does not develop the transformation to regular lattices even with the heat treatment. Thus, in contrast to the present invention, the twin boundary is formed parallel to the interface.

In the present invention, it is not necessarily required for a twin to be formed over the entirety of the antiferromagnetic layer 4, a twin is only required to be formed in at least a part of the antiferromagnetic layer 4. Also, a twin boundary not parallel to the interface is only required to be formed in a part of the twin. Further, a plurality of twin boundaries are not always required to be formed in the twin, a single twin boundary is satisfactory. Where a plurality of twin boundaries are formed in the twin, the twin boundaries are preferably formed almost parallel to each other at substantially constant intervals.

An included angle between the twin boundary and the interface will be described below. The included angle between the twin boundary and the interface is one index for evaluating the crystal orientation of the antiferromagnetic layer 4.

In the present invention, as described above, the included angle between the twin boundary and the interface is preferably in the range of 10° to 67° or in the range of 77° to 90°. An included angle in either range means that crystal grains not in the orientation of {111} plane are present in at least a part of the antiferromagnetic layer 4. The antiferromagnetic layers in FIGS. 10 and 12 and on the lower side of FIG. 16 represent examples in which the included angle is in the range of 10° to 67°. Also, the antiferromagnetic layers in FIG. 14 and on the upper side of FIG. 16 represent examples in which the included angle is in the range of 77° to 90°.

In order to make the twin boundary formed in the antiferromagnetic layer 4 not parallel to the interface as realized in the present invention, in addition to the composition of the antiferromagnetic layer 4, film forming conditions are also important factors. The film forming conditions include, for example, the heat treatment temperature and time, the Ar gas pressure used in forming the antiferromagnetic layer and the ferromagnetic layer, and the distance between the substrate and the target. Several practical values of the film forming conditions are listed, by way of examples, in the above description of the embodiments shown in FIGS. 9 to 16.

Further, in the present invention, grain boundaries formed in the antiferromagnetic layer 4 and the pinned magnetic layer 3 have crystal azimuths differing from each other on either side of the grain boundary. Moreover, at least a portion of the grain boundaries and/or twin boundaries formed in the antiferromagnetic layer are discontinuous from the grain boundaries formed in the ferromagnetic layer at the interface between the antiferromagnetic layer and the ferromagnetic layer. Accordingly, the antiferromagnetic layer 4 has satisfactorily transformed to regular lattices, and the twin boundary is not parallel to the interface. As apparent from the above-described embodiments (see FIGS. 9 to 16), the grain boundaries and/or the twin boundaries formed in the antiferromagnetic layer 4 are discontinuous at the interface from the grain boundaries formed in the pinned magnetic layer 3.

More specifically, as seen from FIGS. 9 and 10, the twin boundaries (2) and the grain boundaries (1) in the antiferromagnetic layer are discontinuous from the grain boundaries (3) in the ferromagnetic layer at the interface. Further, seen from FIGS. 11 and 12, the twin boundaries (7) and the grain boundaries (5) in the antiferromagnetic layer are discontinuous at the interface from the grain boundaries (6) in the ferromagnetic layer. Also seen from FIGS. 13 and 14, the twin boundaries (10) in the antiferromagnetic layer are discontinuous at the interface from the grain boundaries (19) in the ferromagnetic layer. Moreover, seen from FIGS. 15 and 16, the twin boundaries (15), (16) and the grain boundaries (20) in the antiferromagnetic layer are discontinuous at the interface from the grain boundaries (17) in the ferromagnetic layer.

Furthermore, in the present invention, when the antiferromagnetic layer 4 and the pinned magnetic layer 3 contain similar crystal axes in a crystal plane lying in the direction parallel to the interface, at least a part of the crystal axes is preferably oriented in different directions between the antiferromagnetic layer 4 and the pinned magnetic layer 3. That condition impedes epitaxial growth of the antiferromagnetic layer 4 and the pinned magnetic layer 3, and hence enables the antiferromagnetic layer 4 to satisfactorily develop the transformation to regular lattices under the heat treatment.

Additionally, in the present invention, when the antiferromagnetic layer 4 is formed above the pinned magnetic layer 3, as shown in FIG. 1, the composition ratio (atomic percentage (at %)) of the element X or elements X+X' constituting the antiferromagnetic layer is preferably in the range of 47 to 57 (at %). With the composition ratio falling in that range, a strong exchange coupling magnetic field can be produced. Practically, an exchange coupling magnetic field of not less than $3.16 \times 10^4$ (A/m) can be obtained. More preferably, the composition ratio (at %) of the element X or elements X+X' is in the range of 50 to 56 (at %). With the composition ratio falling in that range, an exchange coupling magnetic field of not less than $4.74 \times 10^4$ (A/m) can be obtained in practice.

Figure 2:
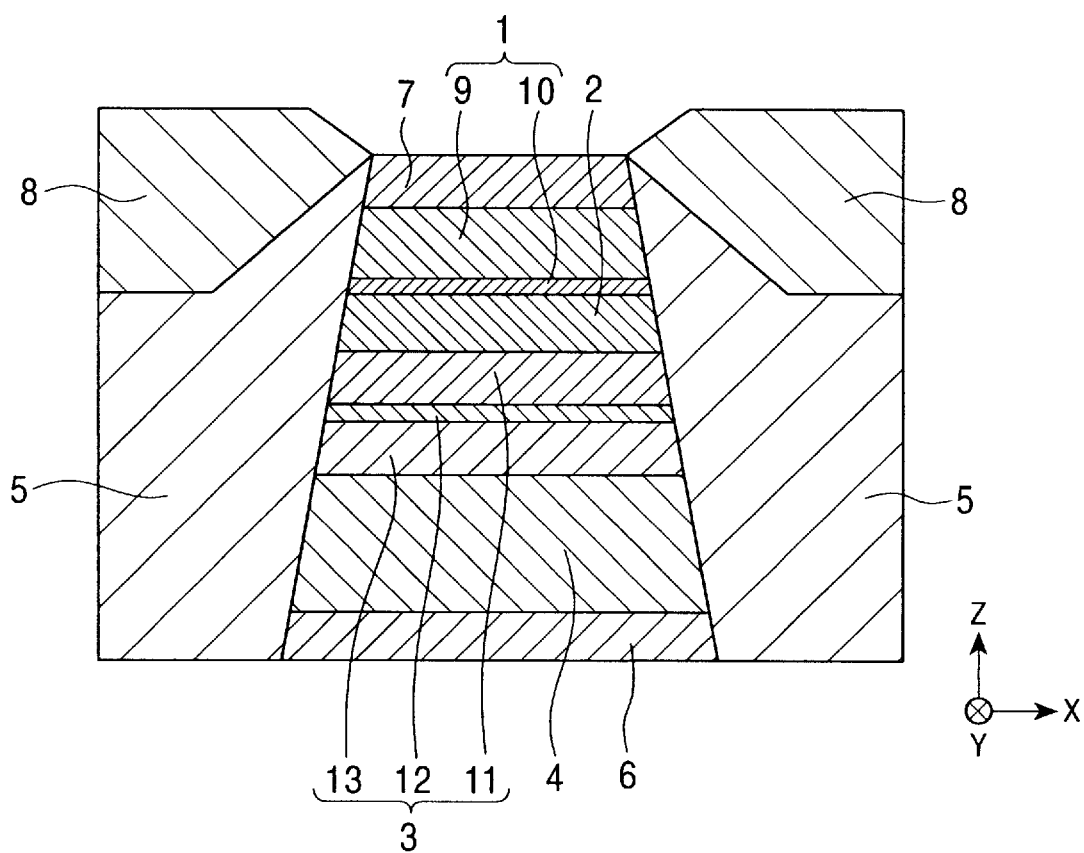
FIG. 2 is a sectional view of a single spin-valve type magnetoresistive sensor according to a second embodiment of the present invention, as viewed from the side facing a recording medium.

FIG. 2 represents a second embodiment of the invention, wherein an antiferromagnetic layer 4 is formed below a pinned magnetic layer 3. In this embodiment, an underlying buffer layer 6, the antiferromagnetic layer 4, the pinned magnetic layer 3, a nonmagnetic intermediate layer 2, and a free magnetic layer 1 are sequentially formed. The materials of the respective layers are the same as those described above with reference to FIG. 1.

Also, in the second embodiment, the antiferromagnetic layer 4 contains twin boundaries that are not formed parallel to the interface between the antiferromagnetic layer 4 and the pinned magnetic layer 3. Thus, the antiferromagnetic layer 4 is satisfactorily transformed from irregular lattices to regular lattices with the heat treatment, and a strong exchange coupling magnetic field can be produced. The twin boundaries (2) in FIGS. 9 and 10, the twin boundaries (7) in FIGS. 11 and 12, the twin boundaries (10) in FIGS. 13 and 14, and the twin boundaries (15), (16) in FIGS. 15 and 16 are all not parallel to the interface.

Further, at least a portion of the twin boundaries and/or the grain boundaries formed in the antiferromagnetic layer 4 are preferably discontinuous at the interface from the grain boundaries formed in the pinned magnetic layer 3.

FIGS. 9 and 10 show that the twin boundaries (2) and the grain boundaries (1) in the antiferromagnetic layer are discontinuous at the interface from the grain boundaries (3) in the ferromagnetic layer. Also, FIGS. 11 and 12 show that the twin boundaries (7) and the grain boundaries (5) in the antiferromagnetic layer are discontinuous at the interface from the grain boundaries (6) in the ferromagnetic layer. Further, FIGS. 13 and 14 show that the twin boundaries (10) in the antiferromagnetic layer are discontinuous at the interface from the grain boundaries (19) in the ferromagnetic layer. Moreover, FIGS. 15 and 16 show that the twin boundaries (15), (16) and the grain boundaries (20) in the antiferromagnetic layer are discontinuous at the interface from the grain boundaries (17) in the ferromagnetic layer.

Further, in the antiferromagnetic layer 4 of this second embodiment, crystal planes other than an equivalent crystal plane represented by the {111} plane are also oriented at least partly among crystal planes lying in the direction parallel to the interface. To obtain that crystal orientation, it is preferable that a seed layer made of NiFe or NiFeCr, for example, is not positioned on the lower side of the antiferromagnetic layer 4. The reason is that the presence of such a seed layer enables the overlying antiferromagnetic layer 4, to readily orient in the {111} plane more easily.

By forming the antiferromagnetic layer 4 on the underlying buffer layer 6 of Ta or $Al_2O_3$, for example, or a lower gap layer 41 (see FIG. 8), the antiferromagnetic layer 4 becomes more likely to orient in crystal planes other than {111} plane.

Even in the case of forming a seed layer on the antiferromagnetic, the antiferromagnetic layer 4 can be prevented from orienting in the plane {111} depending on the film forming conditions and the composition ratio of the antiferromagnetic layer 4. FIG. 11 described above represents such an example. Upon examining the electron-beam diffraction image of FIG. 11, it was confirmed that the antiferromagnetic layer is mostly orientated in the {111} plane, but a portion is not oriented in the {111} plane. Also, because from that the included angle θ between the twin boundary and the interface shown in FIG. 12 is about 42°, the antiferromagnetic layer is not perfectly oriented in the {111} plane.

In addition, when the antiferromagnetic layer 4 is formed below the pinned magnetic layer 3, as shown in FIG. 2, the composition ratio (atomic percentage (at %)) of the element X or elements X+X' constituting the antiferromagnetic layer 4 is preferably in the range of 44 to 57 (at %). With the composition ratio falling in that range, an exchange coupling magnetic field of not less than $3.16 \times 10^4$ (A/m) can be obtained in practice. More preferably, the composition ratio (at %) of the element X or elements X+X' is in the range of 46 to 55 (at %). With the composition ratio falling in that range, an exchange coupling magnetic field of not less than $4.74 \times 10^4$ (A/m) can be obtained in practice.

Figure 3:
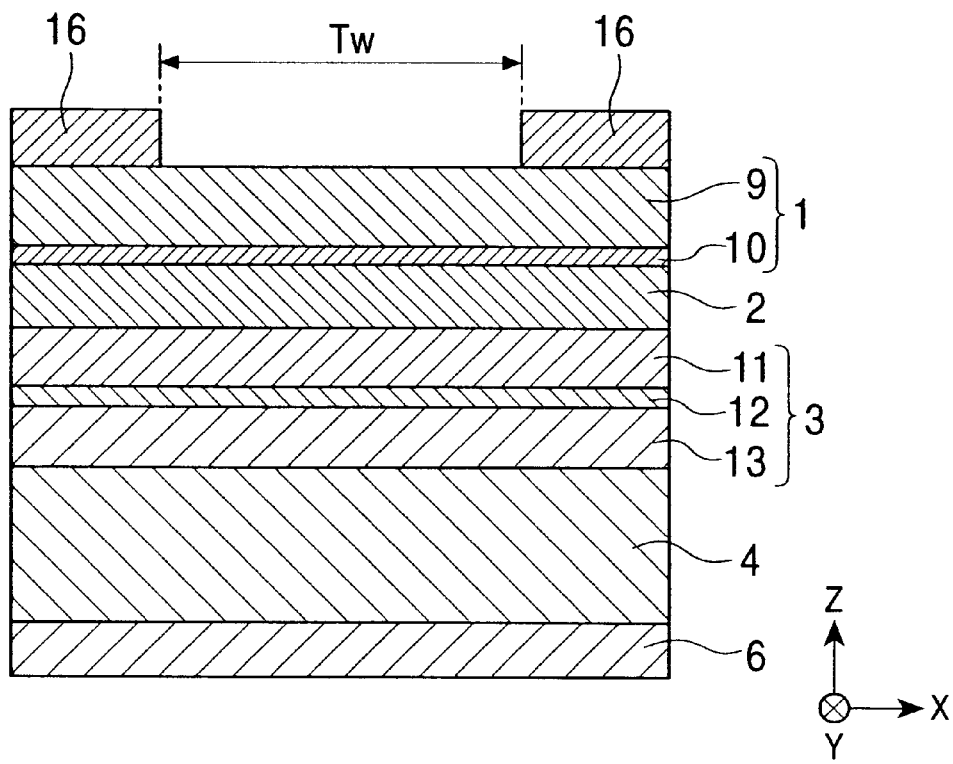
FIG. 3 is a cross-sectional view of a single spin-valve type magnetoresistive sensor according to a third embodiment of the present invention, as viewed from the side facing a recording medium.

FIG. 3 is a partial cross-sectional view showing the structure of a spin-valve type magnetoresistive sensor according to a third embodiment of the present invention.

In the structure of FIG. 3, an underlying buffer layer 6, an antiferromagnetic layer 4, a pinned magnetic layer 3, a nonmagnetic intermediate layer 2, and a free magnetic layer 1 are formed successively in that order from below.

In the spin-valve type magnetoresistive sensor shown in FIG. 3, a twin is formed in at least a part of the antiferromagnetic layer 4, and twin boundaries are formed in at least a part of the twin not parallel to the interface between the antiferromagnetic layer 4 and the pinned magnetic layer 3.

Therefore, when the antiferromagnetic layer 4 is transformed to regular lattices, lattice strains created in a direction parallel to that interface are satisfactorily relaxed due to change of the atomic array into the mirror-symmetrical structure. As a result, the antiferromagnetic layer 4 can develop the transformation to regular lattices effectively, and a strong exchange coupling magnetic field can be produced.

The twin boundaries (2) in FIGS. 9 and 10, the twin boundaries (7) in FIGS. 11 and 12, the twin boundaries (10) in FIGS. 13 and 14, and the twin boundaries (15), (16) in FIGS. 15 and 16 are all not parallel to the interface. Further, at least a portion of the twin boundaries and/or the grain boundaries formed in the antiferromagnetic layer 4 are preferably discontinuous at the interface from the grain boundaries formed in the pinned magnetic layer 3.

FIGS. 9 and 10 show that the twin boundaries (2) and the grain boundaries (1) in the antiferromagnetic layer are discontinuous from the grain boundaries (3) in the ferromagnetic layer at the interface. Also, FIGS. 11 and 12 show that the twin boundaries (7) and the grain boundaries (5) in the antiferromagnetic layer are discontinuous from the grain boundaries (6) in the ferromagnetic layer at the interface. Further, FIGS. 13 and 14 show that the twin boundaries (10) in the antiferromagnetic layer are discontinuous from the grain boundaries (19) in the ferromagnetic layer at the interface. However, FIGS. 15 and 16 show that the twin boundaries (15), (16) and the grain boundaries (20) in the antiferromagnetic layer are discontinuous from the grain boundaries (17) in the ferromagnetic layer at the interface.

The crystal orientation and the composition ratio of the antiferromagnetic layer 4 are the same as those in the spin-valve type magnetoresistive sensor of FIG. 2.

Moreover, as shown in FIG. 3, a pair of exchange bias layers (antiferromagnetic layers) 16 are formed on the free magnetic layer 1 with a spacing corresponding to a track width Tw left therebetween in the direction of track width (X-direction indicated in FIG. 3). Each of the exchange bias layers 16 is formed of an X—Mn alloy (where X represents one or more elements selected from among Pt, Pd, Ir, Rh, Ru and Os). Preferably, a PtMn alloy is used. As an alternative, the exchange bias layer 16 may be formed of an X—Mn—X' alloy (where X' represents one or more elements selected from among Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements).

In this embodiment, a twin is formed in at least a part of the exchange bias layer 16, and a twin boundary is formed in at least a part of the twin that is not parallel to the interface between the exchange bias layer 16 and the free magnetic layer 1. Therefore, when the exchange bias layer 16 is transformed to regular lattices, lattice strain created in a direction parallel to the interface are satisfactorily relaxed due to a change of the atomic array into a mirror-symmetrical structure. As a result, the exchange bias layer 16 can effectively transform to regular lattices, and a strong exchange coupling magnetic field can be produced.

The twin boundaries (2) in FIGS. 9 and 10, the twin boundaries (7) in FIGS. 11 and 12, the twin boundaries (10) in FIGS. 13 and 14, and the twin boundaries (15), (16) in FIGS. 15 and 16 are all not parallel to the interface. Further, at least a portion of the twin boundaries and/or the grain boundaries formed in the antiferromagnetic layer 4 are preferably discontinuous at the interface from the grain boundaries formed in the pinned magnetic layer 3.

FIGS. 9 and 10 show that the twin boundaries (2) and the grain boundaries (1) in the antiferromagnetic layer are discontinuous from the grain boundaries (3) in the ferromagnetic layer of the interface. Also, FIGS. 11 and 12 show that the twin boundaries (7) and the grain boundaries (5) in the antiferromagnetic layer are discontinuous from the grain boundaries (6) in the ferromagnetic layer at the interface. Further, FIGS. 13 and 14 show that the twin boundaries (10) in the antiferromagnetic layer are discontinuous from the grain boundaries (19) in the ferromagnetic layer at the interface. Moreover, FIGS. 15 and 16 show the twin boundaries (15), (16) and the grain boundaries (20) in the antiferromagnetic layer are discontinuous from the grain boundaries (17) in the ferromagnetic layer at the interface.

The crystal orientation and the composition ratio of each of the exchange bias layers 16 are the same as those of the antiferromagnetic layer 4 in the single spin-valve type magnetoresistive sensor of FIG. 1.

At both ends of the free magnetic layer 1, with an exchange coupling magnetic field generated at the interface between the free magnetic layer 1 and the exchange bias layer 16, the free magnetic layer 1 is put into a single domain state in the X-direction, and magnetization of the free magnetic layer 1 in an area corresponding to the track width Tw is appropriately aligned in the X-direction to such an extent that the free magnetic layer 1 is responsive to an external magnetic field.

In the single spin-valve type magnetoresistive sensor thus formed, when an external magnetic field is applied in the Y-direction indicated in FIG. 3, the magnetization of the free magnetic layer 1 in the area corresponding to the track width Tw varies from the X- to Y-direction. The electrical resistance value is changed based on the relationship between a variation in the direction of magnetization occurred in the free magnetic layer 1 and the pinned direction (Y-direction) of magnetization of the pinned magnetic layer 3. A magnetic field leaked from a recording medium is detected from a voltage change caused upon such a change of the electrical resistance value.

Figure 4:
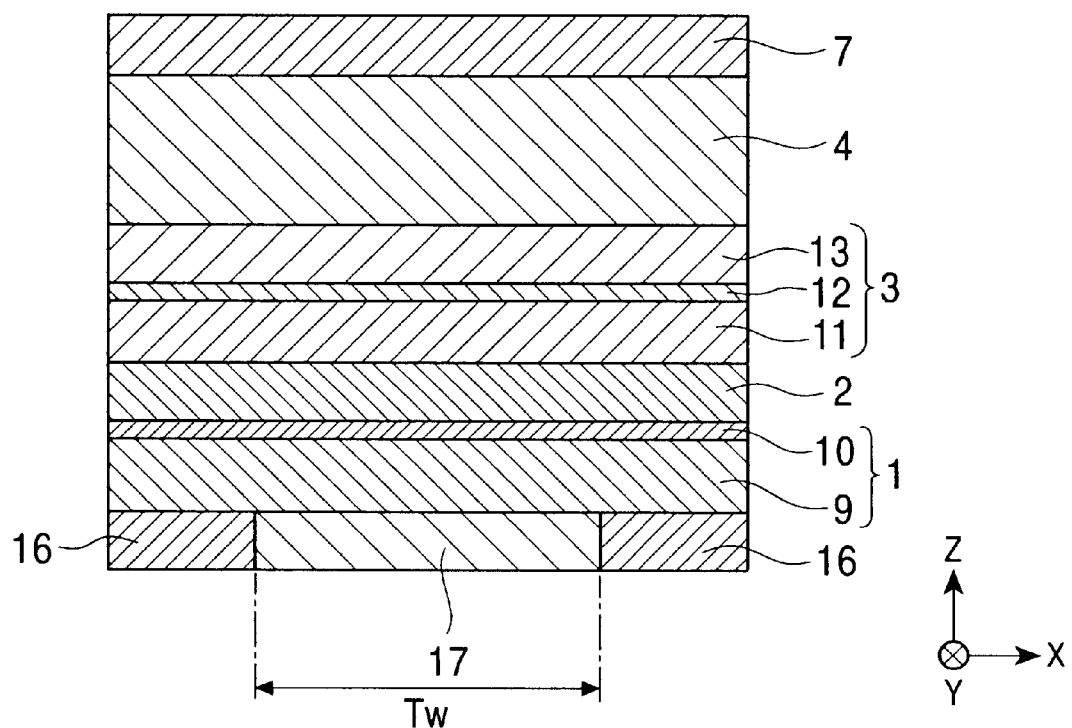
FIG. 4 is a cross-sectional view of a single spinvalve type magnetoresistive sensor according to a fourth embodiment of the present invention, as viewed from the side facing a recording medium.

FIG. 4 is a partial cross-sectional view showing the structure of a spin-valve type magnetoresistive sensor according to a fourth embodiment of the present invention. In the spin-valve type magnetoresistive sensor shown in FIG. 4, a pair of exchange bias layers 16 are formed at the bottom with a spacing corresponding to a track width Tw left therebetween in the direction of track width (X-direction indicated in FIG. 4). The vacant space between the pair of exchange bias layers 16 is filled with an insulating layer 17 formed of an insulating material such as $SiO_2$ or $Al_2O_3$. A free magnetic layer 1 is formed on the exchange bias layer 16 and the insulating layer 17.

In this embodiment, a twin is formed in at least a portion of the exchange bias layer 16, and a twin boundary is formed in at least a portion of the twin that is not parallel to the interface between the exchange bias layer 16 and the free magnetic layer 1. Therefore, when the exchange bias layer 16 is transformed to regular lattices, lattice strains created in a direction parallel to the interface is satisfactorily relaxed due to a change of the atomic array into a mirror-symmetrical structure. As a result, the exchange bias layer 16 can effectively transform to regular lattices, and a strong exchange coupling magnetic field can be produced.

The twin boundaries (2) in FIGS. 9 and 10, the twin boundaries (7) in FIGS. 11 and 12, the twin boundaries (10) in FIGS. 13 and 14, and the twin boundaries (15), (16) in FIGS. 15 and 16 are all not parallel to the interface. Further, at least a portion of the twin boundaries and/or the grain boundaries formed in the antiferromagnetic layer 4 are preferably discontinuous from the grain boundaries formed in the pinned magnetic layer 3 at the interface.

FIGS. 9 and 10 show that the twin boundaries (2) and the grain boundaries (1) in the antiferromagnetic layer are discontinuous from the grain boundaries (3) in the ferromagnetic layer at the interface. Also, FIGS. 11 and 12 show that the twin boundaries (7) and the grain boundaries (5) in the antiferromagnetic layer are discontinuous from the grain boundaries (6) in the ferromagnetic layer at the interface. Further, FIGS. 13 and 14 show that the twin boundaries (10) in the antiferromagnetic layer are discontinuous from the grain boundaries (19) in the ferromagnetic layer at the interface. Moreover, FIGS. 15 and 16 show that the twin boundaries (15), (16) and the grain boundaries (20) in the antiferromagnetic layer are discontinuous from the grain boundaries (17) in the ferromagnetic layer at the interface.

The crystal orientation and the composition ratio of each of the exchange bias layers 16 are the same as those of the antiferromagnetic layer 4 in the single spin-valve type magnetoresistive sensor of FIG. 2.

At both ends of the free magnetic layer 1, with an exchange coupling magnetic field generated at the interface between the free magnetic layer 1 and the exchange bias layer 16, the free magnetic layer 1 is put into a single domain state in the X-direction, and magnetization of the free magnetic layer 1 in an area corresponding to the track width Tw is appropriately aligned in the X-direction to such an extent that the free magnetic layer 1 is responsive to an external magnetic field.

As shown in FIG. 4, a nonmagnetic intermediate layer 2 is formed on the free magnetic layer 1, and a pinned magnetic layer 3 is formed on the nonmagnetic intermediate layer 2. Further, an antiferromagnetic layer 4 is formed on the pinned magnetic layer 3. In the spin-valve type magnetoresistive sensor shown in FIG. 4, a twin is formed in at least a portion of the antiferromagnetic layer 4, and a twin boundary is formed in at least a portion of the twin that is not parallel to the interface between the antiferromagnetic layer 4 and the pinned magnetic layer 3. Therefore, when the antiferromagnetic layer 4 is transformed to regular lattices, lattice strain created in a direction parallel to the interface is satisfactorily relaxed due to a change of the atomic array into a mirror-symmetrical structure. As a result, the antiferromagnetic layer 4 can effectively transfer to regular lattices, and a strong exchange coupling magnetic field can be produced.

The twin boundaries (2) in FIGS. 9 and 10, the twin boundaries (7) in FIGS. 11 and 12, the twin boundaries (10) in FIGS. 13 and 14, and the twin boundaries (15), (16) in FIGS. 15 and 16 are all not parallel to the interface. Further, at least a portion of the twin boundaries and/or the grain boundaries formed in the antiferromagnetic layer 4 are preferably discontinuous from the grain boundaries formed in the pinned magnetic layer 3 at the interface.

FIGS. 9 and 10 show that the twin boundaries (2) and the grain boundaries (1) in the antiferromagnetic layer are discontinuous from the grain boundaries (3) in the ferromagnetic layer at the interface. Also, FIGS. 11 and 12 show that the twin boundaries (7) and the grain boundaries (5) in the antiferromagnetic layer are discontinuous from the grain boundaries (6) in the ferromagnetic layer at the interface. Further, FIGS. 13 and 14 show that the twin boundaries (10) in the antiferromagnetic layer are discontinuous from the grain boundaries (19) in the ferromagnetic layer at the interface. Moreover, FIGS. 15 and 16 show that the twin boundaries (15), (16) and the grain boundaries (20) in the antiferromagnetic layer are discontinuous from the grain boundaries (17) in the ferromagnetic layer at the interface.

The crystal orientation and the composition ratio of the antiferromagnetic layer are the same as those in the spin-valve type magnetoresistive sensor of FIG. 1.

Figure 5:
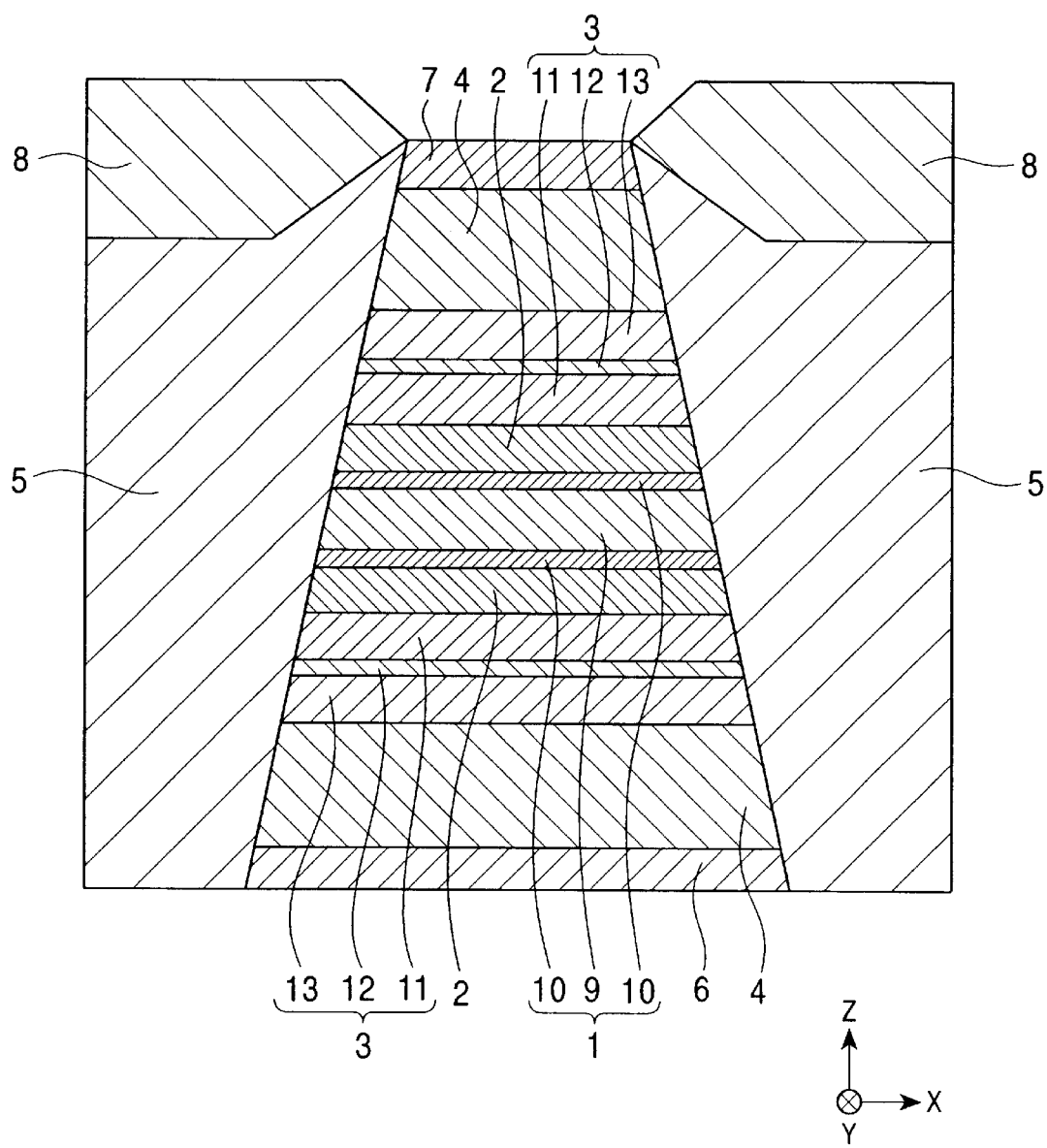
FIG. 5 is a sectional view of a dual spin-valve type magnetoresistive sensor according to a fifth embodiment of the present invention, as viewed from the side facing a recording medium.

FIG. 5 is a partial sectional view showing the structure of a dual spin-valve type magnetoresistive sensor according to a fifth embodiment of the present invention. In the structure of FIG. 5, an antiferromagnetic layer 4, a pinned magnetic layer 3, a nonmagnetic intermediate layer 2, and a free magnetic layer 1 are sequentially formed on an underlying buffer layer 6. The free magnetic layer 1 is formed as a three-layer film made up of, for example, two Co films 10 with a NiFe alloy film 9 interposed therebetween. Further, another nonmagnetic intermediate layer 2, another pinned magnetic layer 3, another antiferromagnetic layer 4, and a protective barrier layer 7 are sequentially formed on the free magnetic layer 1.

Moreover, a pair of hard bias layers 5 and a pair of conductive layers 8 are formed one above the other on both sides of a film multilayered defined between the underlying buffer layer 6, and the protective barrier layer 7. The respective layers are made of the same materials as those described with reference to FIGS. 1 and 2.

In this fifth embodiment, the composition ratio of the element X or elements X+X' constituting the antiferromagnetic layer 4 as viewed in FIG. 5, is preferably in the range of 44 to 57 (at %) and, more preferably, in the range of 46 to 55 (at %). Also, the composition ratio of the element X or elements X+X' constituting the antiferromagnetic layer 4 positioned above the free magnetic layer 1, as viewed in FIG. 5, is preferably in the range of 47 to 57 (at %) and more preferably in the range of 50 to 56 (at %). Further, in this fifth embodiment, a twin is formed in at least a portion of the antiferromagnetic layer 4, and a twin boundary is formed in at least a portion of the twin that is not parallel to the interface between the antiferromagnetic layer 4 and the pinned magnetic layer 3. Therefore, when the antiferromagnetic layer 4 is transformed to regular lattices, lattice strains created in a direction parallel to that interface is satisfactorily relaxed due to a change of the atomic array into a mirror-symmetrical structure. As a result, the antiferromagnetic layer 4 can effectively transform to regular lattices, and a strong exchange coupling magnetic field can be produced.

The twin boundaries (2) in FIGS. 9 and 10, the twin boundaries (7) in FIGS. 11 and 12, the twin boundaries (10) in FIGS. 13 and 14, and the twin boundaries (15), (16) in FIGS. 15 and 16 are all not parallel to the interface. Further, at least a portion of the twin boundaries and/or the grain boundaries formed in the antiferromagnetic layer 4 are preferably discontinuous from the grain boundaries formed in the pinned magnetic layer 3 at the interface.

FIGS. 9 and 10 show that the twin boundaries (2) and the grain boundaries (1) in the antiferromagnetic layer are discontinuous from the grain boundaries (3) in the ferromagnetic layer at the interface. Also, FIGS. 11 and 12 show that the twin boundaries (7) and the grain boundaries (5) in the antiferromagnetic layer are discontinuous from the grain boundaries (6) in the ferromagnetic layer at the interface. Further, FIGS. 13 and 14 show that the twin boundaries (10) in the antiferromagnetic layer are discontinuous from the grain boundaries (19) in the ferromagnetic layer at the interface. Moreover, FIGS. 15 and 16 show that the twin boundaries (15), (16) and the grain boundaries (20) in the antiferromagnetic layer are discontinuous from the grain boundaries (17) in the ferromagnetic layer at the interface.

The crystal orientation and the composition ratio of the antiferromagnetic layer are the same as those in the spin-valve type magnetoresistive sensors of FIGS. 1 and 2.

Figure 6:
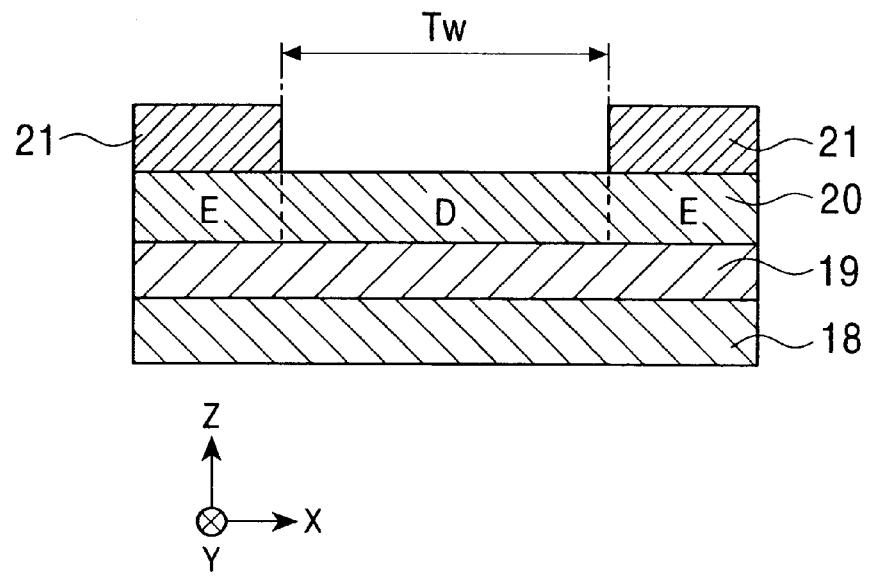
FIG. 6 is a cross-sectional view of an AMR type magnetoresistive sensor according to a sixth embodiment of the present invention, as viewed from the side facing a recording medium.
Figure 7:
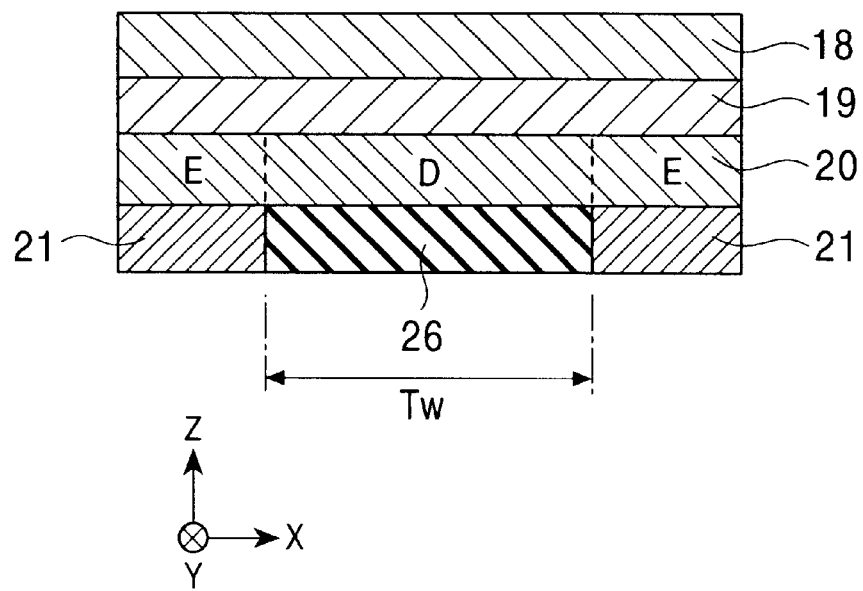
FIG. 7 is a cross-sectional view of an AMR type magnetoresistive sensor according to a seventh embodiment of the present invention, as viewed from the side facing a recording medium.

FIGS. 6 and 7 are cross-sectional views showing the structure of AMR type magnetoresistive sensors according to sixth and seventh embodiments of the present invention. In the structure of FIG. 6, a nonmagnetic (SHUNT) layer 19, and a magnetoresistive (MR) layer 20 are sequentially formed on a soft magnetic (SAL) layer 18. For example, the soft magnetic layer 18 is formed a Fe—Ni—Nb alloy, the nonmagnetic layer 19 is formed of a Ta film, and the magnetoresistive layer 20 is formed of a NiFe alloy.

On the magnetoresistive layer 20, a pair of exchange bias layers (antiferromagnetic layers) 21 are formed in opposite areas of the magnetoresistive layer 20 with a spacing therebetween corresponding to a track width Tw in the direction of track width (X-direction indicated in FIG. 6). Though not shown, a conductive layer is formed, for example, on each of the exchange bias layers 21.

In the structure of FIG. 7, a pair of exchange bias layers 21 are formed at the bottom with a spacing therebetween corresponding to a track width Tw in the direction of track width (X-direction indicated in FIG. 7). A vacant space between the pair of exchange bias layers 21 is filled with an insulating layer 26 formed of an insulating material such as $SiO_2$ or $Al_2O_3$. Further, a magnetoresistive (MR) layer 20, a nonmagnetic (SHUNT) layer 19, and a soft magnetic (SAL) layer 18 are sequentially formed on the pair of exchange bias layers 21 and the insulating layer 26.

In the AMR type magnetoresistive sensors of the fifth and sixth embodiments shown in FIGS. 6 and 7, a twin is formed in at least a portion of the exchange bias layer 21, and a twin boundary is formed in at least a portion of the twin that is not parallel to the interface between the exchange bias layer 21 and the a magnetoresistive layer 20. Therefore, when the exchange bias layer 21 is transformed to regular lattices, lattice strains created in a direction parallel to the interface is satisfactorily relaxed due to a change of the atomic array into a mirror-symmetrical structure. As a result, the antiferromagnetic layer 4 can effectively transform to regular lattices, and a strong exchange coupling magnetic field can be produced.

The twin boundaries (2) in FIGS. 9 and 10, the twin boundaries (7) in FIGS. 11 and 12, the twin boundaries (10) in FIGS. 13 and 14, and the twin boundaries (15), (16) in FIGS. 15 and 16 are all apparently not parallel to the interface. Further, at least a portion of the twin boundaries and/or the grain boundaries formed in the antiferromagnetic layer 4 are preferably discontinuous at the interface from the grain boundaries formed in the pinned magnetic layer 3.

FIGS. 9 and 10 show that the twin boundaries (2) and the grain boundaries (1) in the antiferromagnetic layer are discontinuous from the grain boundaries (3) in the ferromagnetic layer at the interface. Also, FIGS. 11 and 12 show that the twin boundaries (7) and the grain boundaries (5) in the antiferromagnetic layer are discontinuous from the grain boundaries (6) in the ferromagnetic layer at the interface. Further, FIGS. 13 and 14 show that the twin boundaries (10) in the antiferromagnetic layer are discontinuous from the grain boundaries (19) in the ferromagnetic layer at the interface. Moreover, FIGS. 15 and 16 show that the twin boundaries (15) and (16) and the grain boundaries (20) in the antiferromagnetic layer are discontinuous from the grain boundaries (17) in the ferromagnetic layer at the interface.

The crystal orientation and the composition ratio of the exchange bias layers 21 are the same as those in the spin-valve type magnetoresistive sensors of FIGS. 1 and 2.

In the AMR type magnetoresistive sensors shown in FIGS. 6 and 7, areas E of the magnetoresistive layer 20 are put into the single domain state in the X-direction with an exchange coupling magnetic field generated at the interfaces between the pair of exchange bias layers 21 and the magnetoresistive layer 20. Correspondingly, magnetization in area D of the magnetoresistive layer 20 is aligned in the X-direction. Also, a current-induced magnetic field generated by a detection current flowing through the magnetoresistive layer 20 is applied to the soft magnetic layer 18, and a transverse bias magnetic field is applied to the area D of the magnetoresistive layer 20 in the Y-direction with static magnetic coupling energy produced by the soft magnetic layer 18. As a result of the transverse bias magnetic field being applied to the area D of the magnetoresistive layer 20 area D put into the single domain state in the X-direction. Accordingly, the sensor can be set to a condition such that a resistance change relative to a change of magnetic field in the area D of the magnetoresistive layer 20 (i.e., magnetoresistive characteristic: H-R characteristic) is linear.

In operation, recording medium is moved in the Z-direction. When a leak magnetic field is applied in the Y-direction, a resistance value of the area D of the magnetoresistive layer 20 is changed and the resistance value change is detected as a voltage change.

Figure 8:
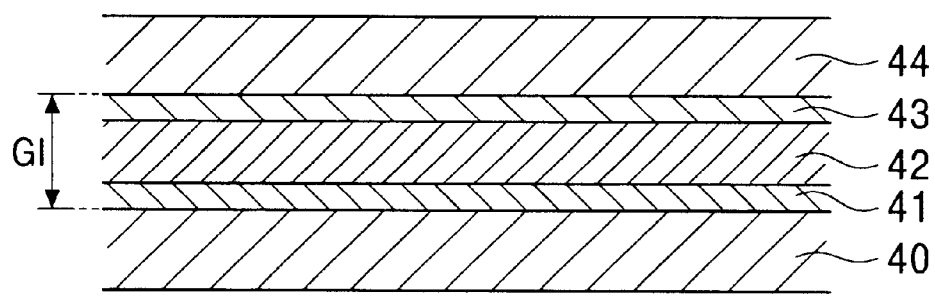
FIG. 8 is a partial sectional view of a thin-film magnetic head according to the present invention, as viewed from the side facing a recording medium.

FIG. 8 is a partial sectional view of a thin-film magnetic head according to the present invention, as viewed from the side of a head surface facing a recording medium. In FIG. 8, numeral 40 denotes a lower shield layer made of, for example, Permalloy or Sendust. On the lower shield layer 40, a magnetoresistive sensor 42 having the structure shown in any of FIGS. 1 to 7 is formed with a lower gap layer 41 interposed therebetween. On the magnetoresistive sensor 42, an upper shield layer 44 made of, for example, Permalloy is formed with an upper gap layer 43 made of, for example, alumina interposed therebetween.

The thin-film magnetic head of FIG. 8 is an MR head for playback, that includes the magnetoresistive sensor 42. An inductive head for recording may be formed on the upper side of the MR head. The inductive head is made up of a core layer and a coil layer. With the structure of FIG. 8, a thin-film magnetic head can be manufactured which has superior stability in playback characteristics and a high resistance change rate (ΔR/R).

In the above-described embodiments shown in FIGS. 9 to 16, the antiferromagnetic layer is under random orientation. However, even when crystal planes in the antiferromagnetic layer are preferentially oriented, for example, as those other than the {111} plane, an antiferromagnetic material constituting the antiferromagnetic layer is satisfactorily transformed from irregular lattices to regular lattices. A strong exchange coupling magnetic field can be similarly obtained so long as a twin boundary formed in the antiferromagnetic layer is not parallel to the interface between the antiferromagnetic layer and the ferromagnetic layer. Preferably, at least a portion of the twin boundaries and/or grain boundaries formed in the antiferromagnetic layer are discontinuous at the interface from grain boundaries formed in the ferromagnetic layer. Such crystal orientation is also applicable to the structure of the magnetoresistive sensor 42 shown in any of FIGS. 1 to 7.

According to the present invention fully described above, a twin boundary is formed in at least a portion of a twin in the antiferromagnetic layer that is not parallel to the interface between the antiferromagnetic layer and the ferromagnetic layer. With that crystal orientation, when the antiferromagnetic layer is transformed to regular lattices, the atomic array is changed to a mirror-symmetrical structure and, therefore, lattice strain created in a direction parallel to the interface can be relaxed. As a result, the transformation to regular lattices in the antiferromagnetic layer can be effectively promoted, and a strong exchange coupling magnetic field can be produced. Further, the exchange coupling film according to the present invention can be applied to various types of magnetoresistive sensors. Any type of magnetoresistive sensor and a thin-film magnetic head, each employing the exchange coupling film of the present invention, can be properly adapted for an expected future tendency toward higher recording density.

What is claimed is:

1. An exchange coupling film comprising:
   an antiferromagnetic layer and a ferromagnetic layer formed in contact with each other, such that a direction of magnetization of said ferromagnetic layer is held in a certain direction by an exchange coupling magnetic field generated at an interface between said antiferromagnetic layer and said ferromagnetic layer,
   wherein crystal planes in said antiferromagnetic layer, other than an equivalent {111} crystal plane are oriented at least partly among crystal planes lying in a direction parallel to said interface, and
   wherein a twin is formed in at least a portion of said antiferromagnetic layer, and one or more twin boundaries are formed in at least a portion of the twin that is not parallel to said interface.

2. An exchange coupling film according to claim 1, wherein an included angle between said twin boundary and said interface is in the range of 10° to 67° or in the range of 77° to 90°.

3. An exchange coupling film according to claim 1, wherein grain boundaries reside in said antiferromagnetic layer and said ferromagnetic layer, wherein crystal azimuths differ from each other on both sides of said grain boundary, and wherein at least a portion of said grain boundaries or twin boundaries or both residing in said antiferromagnetic layer are discontinuous from said grain boundaries residing in said ferromagnetic layer at said interface.

4. An exchange coupling film according to claim 1, wherein an equivalent {111} crystal plane is preferentially oriented in said ferromagnetic layer and wherein either a) equivalent crystal planes other than equivalent {111} crystal planes are preferentially oriented in said antiferromagnetic layer or b) crystal planes in said antiferromagnetic layer are randomly oriented.

5. An exchange coupling film according to claim 1, further comprising a pinned magnetic layer adjacent to said antiferromagnetic layer, wherein either a) crystal planes other than an equivalent {111} crystal plane are preferentially oriented in each of said antiferromagnetic layer and said pinned magnetic layer, or b) crystal planes in both said antiferromagnetic layer and said pinned magnetic layer are randomly oriented.

6. An exchange coupling film according to claim 1, wherein said antiferromagnetic layer comprises an antiferromagnetic material containing an element X and Mn, wherein X is selected from the group consisting of Pt, Pd, Ir, Rh, Ru and Os and combinations thereof.

7. An exchange coupling film according to claim 1, wherein said antiferromagnetic layer comprises an element X, and element X' and Mn, wherein X is selected from the group consisting of Pt, Pd, Ir, Rh, Ru and Os and combinations thereof, and wherein X is selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements and combinations thereof.

8. An exchange coupling film according to claim 7, wherein said antiferromagnetic material comprises a material selected from the group consisting of an intrusion-type solid solution in which said element X intrudes in gaps between space lattices constituted by said element X and Mn, and a substitution-type solid solution in which said element X substitutes for a portion of lattice points of crystal lattices constituted by said element X and Mn.

9. An exchange coupling film according to claim 1, further comprising a layer selected from the group consisting of a buffer film and a lower gap layer underlying said antiferromagnetic layer.

10. A magnetoresistive sensor comprising an antiferromagnetic layer; a pinned magnetic layer formed in contact with said antiferromagnetic layer and having a direction of magnetization pinned by an exchange anisotropic magnetic field generated in cooperation with said antiferromagnetic layer; a free magnetic layer comprising a multilayer structure; and a bias layer for aligning a direction of magnetization of said free magnetic layer in a direction crossing said direction of magnetization of said pinned magnetic layer, wherein said antiferromagnetic layer and said pinned magnetic layer comprise said exchange coupling film recited in claim 1.

11. A magnetoresistive sensor according to claim 10, wherein an included angle in said exchange coupling film between said twin boundary and said interface is in the range of 10° to 67° or in the range of 77° to 90°.

12. A magnetoresistive sensor according to claim 10, wherein, in said exchange coupling film, grain boundaries in said antiferromagnetic layer and said ferromagnetic layer, wherein crystal azimuths differ from each other on both sides of said grain boundaries, and wherein at least a portion of said grain boundaries or twin boundaries or both in said antiferromagnetic layer are discontinuous from said grain boundaries formed in said ferromagnetic layer at said interface.

13. A magnetoresistive sensor according to claim 10, wherein an equivalent {111} crystal plane is preferentially oriented in said ferromagnetic layer and wherein either a) crystal planes other than equivalent {111} planes are preferentially oriented in said antiferromagnetic layer, or b) crystal planes in said antiferromagnetic layer are randomly oriented.

14. A magnetoresistive sensor according to claim 10, wherein crystal planes in said exchange coupling film, other than an equivalent {111} crystal plane are either a) preferentially oriented in each of said antiferromagnetic layer and said pinned magnetic layer, or b) crystal planes in both said antiferromagnetic layer and said pinned magnetic layer are randomly oriented.

15. A magnetoresistive sensor according to claim 10, wherein, in said exchange coupling film, said antiferromagnetic layer comprises an antiferromagnetic material containing an element X and Mn wherein X is selected from the group consisting of Pt, Pd, Ir, Rh, Ru and Os and combinations thereof.

16. A magnetoresistive sensor according to claim 10, wherein said antiferromagnetic layer in said exchange coupling film comprises an element X, an element XE and Mn, wherein X is selected from the group consisting of Pt, Pd, Ir, Rh, Ru and Os and wherein XE is selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements and combinations thereof.

17. A magnetoresistive sensor according to claim 16, wherein said antiferromagnetic layer comprises a material selected from the group consisting of an intrusion-type solid solution in which said element XE intrudes in gaps between space lattices constituted by said element X and Mn, and a substitution-type solid solution in which said element XE substitutes for a portion of lattice points of crystal lattices constituted by said element X and Mn.

18. A magnetoresistive sensor according to claim 10, further comprising a layer selected from the group consisting of a buffer film and a lower gap layer underlying said antiferromagnetic layer in said exchange coupling film.

19. A magnetoresistive sensor comprising: an antiferromagnetic layer; a pinned magnetic layer formed in contact with said antiferromagnetic layer and having a direction of magnetization pinned by an exchange anisotropic magnetic field generated in cooperation with said antiferromagnetic layer; a free magnetic layer comprising a multilayered structure; and antiferromagnetic exchange bias layers adjacent to said free magnetic layer, wherein said antiferromagnetic exchange bias layers are separated by a space oriented in a track width direction, wherein said antiferromagnetic exchange bias layers and said free magnetic layer comprise said exchange coupling film recited in claim 1.

20. A magnetoresistive sensor according to claim 19, wherein an included angle in said exchange coupling film between said twin boundary and said interface is in the range of 10° to 67° or in the range of 77° to 90°.

21. A magnetoresistive sensor according to claim 19, wherein, in said exchange coupling film, grain boundaries in said antiferromagnetic layer and said ferromagnetic layer, wherein crystal azimuths differ from each other on both sides of said grain boundaries, and wherein at least a portion of said grain boundaries or twin boundaries or both in said antiferromagnetic layer are discontinuous from said grain boundaries formed in said ferromagnetic layer at said interface.

22. A magnetoresistive sensor according to claim 19, wherein, an equivalent {111} crystal plane is preferentially oriented in said ferromagnetic layer, and wherein either a) crystal planes other than equivalent {111} planes are preferentially oriented in said antiferromagnetic layer, or b) crystal planes in said antiferromagnetic layer are randomly oriented.

23. A magnetoresistive sensor according to claim 19, wherein, crystal planes in said exchange coupling film, other than an equivalent {111} crystal plane are either a) preferentially oriented in each of said antiferromagnetic layer and said pinned magnetic layer, or b) crystal planes in both said antiferromagnetic layer and said pinned magnetic layer are randomly oriented.

24. A magnetoresistive sensor according to claim 19, wherein, in said antiferromagnetic layer in said exchange coupling film, comprises an antiferromagnetic material containing an element X and Mn where X is selected from the group consisting of Pt, Pd, Ir, Rh, Ru and Os and combinations thereof.

25. A magnetoresistive sensor according to claim 19, wherein, said antiferromagnetic layer in said exchange coupling film, comprises an element X an element X' and Mn, where X is selected from the group consisting of Pt, Pd, Ir, Rh, Ru and Os, and wherein X' is selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements, and combinations thereof.

26. A magnetoresistive sensor according to claim 25, wherein, said antiferromagnetic layer in said exchange coupling film, comprises a material selected from the group consisting of an intrusion type solid solution in which said element X' intrudes in gaps between space lattices constituted by said element X and Mn, and a substitution type solid solution in which said element X' substitutes for a portion of lattice points of crystal lattices constituted by the element X and Mn.

27. A magnetoresistive sensor according to claim 19 further comprising a layer selected from the group consisting of a buffer film anda lower gap layer underlying said antiferromagnetic layer in said exchange coupling film.

28. A magnetoresistive sensor comprising: first and second nonmagnetic intermediate layers formed on an upper side and a lower side of a free magnetic layer, respectively; first and second pinned magnetic layers positioned on an upper side of said first nonmagnetic intermediate layer and on a lower side of said second nonmagnetic intermediate layer, respectively; first and second antiferromagnetic layers positioned on an upper side of said first pinned magnetic layer and on a lower side of said second pinned magnetic layer, respectively, for making a direction of magnetization of said first and second pinned magnetic layers pinned in a certain direction by an exchange anisotropic magnetic field; and a bias layer for aligning a direction of magnetization of said free magnetic layer in a direction crossing the direction of magnetization of said first and second pinned magnetic layers,
wherein one or both said first antiferromagnetic layer and said first pinned magnetic layer and said second antiferromagnetic layer and said second pinned magnetic layer comprise an exchange coupling film recited in claim 1.

29. A magnetoresistive sensor according to claim 28, wherein, an included angle in said exchange coupling film between said twin boundary and said interface is in the range of 10° to 67° or in the range of 77° to 90°.

30. A magnetoresistive sensor according to claim 28, wherein, with respect to either said first antiferromagnetic layer and said first pinned magnetic layer on said second antiferromagnetic layer and said second pinned magnetic layer, in said exchange coupling film, grain boundaries in said antiferromagnetic layer and said pinned magnetic layer, wherein crystal azimuths differ from each other on both sides of said grain boundaries, and wherein at least a portion of said grain boundaries or twin boundaries or both in said antiferromagnetic layer are discontinuous from said grain boundaries formed in said pinned magnetic layer at said interface.

31. A magnetoresistive sensor according to claim 28, wherein, with respect to either said first antiferromagnetic layer and said first pinned magnetic layer on said second antiferromagnetic layer and said second pinned magnetic layer, an equivalent {111} crystal plane is preferentially oriented in said pinned magnetic layer, and wherein either a) crystal planes other than equivalent {111} planes are preferentially oriented in said antiferromagnetic layer, or b) crystal planes in said antiferromagnetic layer are randomly oriented.

32. A magnetoresistive sensor according to claim 28, wherein, with respect to either said first antiferromagnetic layer and said first pinned magnetic layer on said second antiferromagnetic layer and said second pinned magnetic layer, crystal planes in said exchange coupling film, other than an equivalent {111} crystal plane are either a) preferably oriented in each of said antiferromagnetic layer and said pinned magnetic layer, or b) crystal planes in both said antiferromagnetic layer and said pinned magnetic layer are randomly oriented.

33. A magnetoresistive sensor according to claim 28, wherein, with respect to either said first or said second antiferromagnetic layer, said antiferromagnetic layer in said exchange coupling film, comprises an antiferromagnetic material containing an element X and Mn, where X is selected from the group consisting Pt, Pd, Ir, Rh, Ru and Os and combinations thereof.

34. A magnetoresistive sensor according to claim 28, wherein, with respect to either said first or said second antiferromagnetic layer, said antiferromagnetic layer in said exchange coupling film comprises an element X, an element X' and Mn, wherein X is selected from the group consisting of Pt, Pd, Ir, Rh, Ru and Os, and wherein X' is selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements and combinations thereof.

35. A magnetoresistive sensor according to claim 34, wherein, with respect to either said first or said second antiferromagnetic layer, said antiferromagnetic layer in said exchange coupling film, comprises a material selected from the group consisting of an intrusion-type solid solution in which said element X' intrudes in gaps between space lattices constituted by said element X and Mn, and a substitution-type solid solution in which said element X' substitutes for a portion of lattice points of crystal lattices constituted by said element X and Mn.

36. A magnetoresistive sensor according to claim 28 further comprising, layer selected from the group consisting of a buffer film and a lower gap layer underlying said second antiferromagnetic layer in said exchange coupling film.

37. A magnetoresistive sensor comprising: a magnetoresistive layer; a soft magnetic layer; a nonmagnetic layer between said soft magnetic layer and said magnetoresistive layer; and antiferromagnetic-layers formed on said magnetoresistive layer wherein said antiferromagnetic layers are separated by a space oriented in a direction of track width, and
wherein said antiferromagnetic layers and said magnetoresistive layer comprise said exchange coupling film recited in claim 1.

38. A magnetoresistive sensor according to claim 37, wherein, an included angle in said exchange coupling film, between said twin boundary and said interface is in the range of 10° to 67° or in the range of 77° to 90°.

39. A magnetoresistive sensor according to claim 37, wherein, in said exchange coupling film, grain boundaries in said antiferromagnetic layers and said magnetoresistive layer, wherein crystal azimuths differ from each other on both sides of said grain boundaries, and wherein at least a portion of said grain boundaries or twin boundaries or both in said antiferromagnetic layers are discontinuous from said grain boundaries formed in said magnetoresistive layer at said interface.

40. A magnetoresistive sensor according to claim 37, wherein, an equivalent {111} crystal plane is preferentially oriented in said magnetoresistive layer, and wherein either a)

crystal planes other than equivalent {111} planes are preferentially oriented in said antiferromagnetic layers with priority, or b) crystal planes in said antiferromagnetic layers are randomly oriented.

41. A magnetoresistive sensor according to claim 37, wherein, crystal planes in said exchange coupling film, other than an equivalent {111} crystal plane are either a) preferentially oriented in each of said antiferromagnetic layers and said pinned magnetic layer, or b) crystal planes in both said antiferromagnetic layer and said pinned magnetic layer are randomly oriented.

42. A magnetoresistive sensor according to claim 37, wherein, said antiferromagnetic layer in said exchange coupling film comprises an antiferromagnetic material containing an element X and Mn, wherein X is selected from the group consisting Pt, Pd, Ir, Rh, Ru and Os and combinations thereof.

43. A magnetoresistive sensor according to claim 37, wherein, said antiferromagnetic layer in said exchange coupling film comprises an element X, an element X' and Mn, wherein X is selected from the group consisting of Pt, Pd, Ir, Rh, Ru and Os, and wherein X' is selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements and combinations thereof.

44. A magnetoresistive sensor according to claim 43, wherein, said antiferromagnetic layer in said exchange coupling film comprises a material selected from the group consisting of an intrusion-type solid solution in which said element X' intrudes in gaps between space lattices constituted by said element X and Mn, and a substitution type solid solution in which said element X' substitutes for a portion of lattice points of crystal lattices constituted by said element X and Mn.

45. A magnetoresistive sensor according to claim 37 further comprising a layer selected from the group consisting of a buffer film and a lower gap layer underlying said antiferromagnetic layer in said exchange coupling film.

46. A thin-film magnetic head comprising shield layers and a magnetoresistive sensor, wherein said shield layers reside on upper and lower sides of said magnetoresistive sensor and are separated therefrom by gap layers, said magnetoresistive sensor arranged in accordance with said magnetoresistive sensor recited in claim 10.

47. A thin-film magnetic head comprising shield layers and a magnetoresistive sensor, wherein said shield layers reside on upper and lower sides of said magnetoresistive sensor and are separated therefrom by gap layers, said magnetoresistive sensor arranged in accordance with said magnetoresistive sensor recited in claim 19.

48. A thin-film magnetic head comprising shield layers and a magnetoresistive sensor, wherein said shield layers reside on upper and lower sides of said magnetoresistive sensor and are separated therefrom by gap layers, said magnetoresistive sensor arranged in accordance with said magnetoresistive sensor recited in claim 28.

49. A thin-film magnetic head comprising shield layers and a magnetoresistive sensor, wherein said shield layers reside on upper and lower sides of said magnetoresistive sensor and are separated therefrom by gap layers, said magnetoresistive sensor arranged in accordance with said magnetoresistive sensor recited in claim 37.

\* \* \* \* \*

UNITED STATES PATENT AND TRADEMARK OFFICE
CERTIFICATE OF CORRECTION

PATENT NO.    : 6,504,688 B2
DATED         : January 7, 2003
INVENTOR(S)   : Naoya Hasegawa et al.

It is certified that error appears in the above-identified patent and that said Letters Patent is hereby corrected as shown below:

<u>Column 28,</u>
Line 6, after "consisting" insert -- of --.

<u>Column 29,</u>
Line 5, after "consisting" insert -- of --.

Signed and Sealed this

Fifteenth Day of April, 2003

JAMES E. ROGAN
*Director of the United States Patent and Trademark Office*